(12) United States Patent
Takatsuka et al.

(10) Patent No.: US 9,992,431 B2
(45) Date of Patent: Jun. 5, 2018

(54) SIGNAL PROCESSING DEVICE, IMAGING ELEMENT, AND ELECTRONIC APPARATUS

(71) Applicant: SONY CORPORATION, Tokyo (JP)

(72) Inventors: Takafumi Takatsuka, Kanagawa (JP); Yusuke Oike, Kanagawa (JP); Masaki Sakakibara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 15/521,415

(22) PCT Filed: Oct. 22, 2015

(86) PCT No.: PCT/JP2015/079819
§ 371 (c)(1),
(2) Date: Apr. 24, 2017

(87) PCT Pub. No.: WO2016/072280
PCT Pub. Date: May 12, 2016

(65) Prior Publication Data
US 2017/0324918 A1    Nov. 9, 2017

(30) Foreign Application Priority Data

Nov. 5, 2014  (JP) .................................. 2014-225188

(51) Int. Cl.
*H03M 1/00* (2006.01)
*H04N 5/363* (2011.01)
(Continued)

(52) U.S. Cl.
CPC ............. *H04N 5/363* (2013.01); *H04N 5/374* (2013.01); *H04N 5/378* (2013.01); *H03M 1/12* (2013.01)

(58) Field of Classification Search
CPC ............. H04N 5/3698; H04N 5/37455; H04N 5/37457; H04N 5/378; H04N 5/357; H03M 1/34; H03M 1/204; H03M 1/205
(Continued)

(56) References Cited

U.S. PATENT DOCUMENTS

2013/0016264 A1* 1/2013 Ono ........................ H04N 5/335
                                                              348/308
2013/0300906 A1* 11/2013 Yan ........................ H04N 5/378
                                                              348/302
(Continued)

FOREIGN PATENT DOCUMENTS

| JP | 2011-041091 A | 2/2011 |
| JP | 2013-251677 A | 12/2013 |
| WO | 2013/084809 A1 | 6/2013 |

*Primary Examiner* — Kelly L Jerabek
(74) *Attorney, Agent, or Firm* — Chip Law Group

(57) ABSTRACT

The present technology relates to a signal processing device, an imaging element, and an electronic apparatus configured so that a cost increase can be suppressed. A signal processing device of the present technology includes: a comparison unit configured to compare a signal level of an analog signal with a signal level of a reference signal; a selection unit configured to select, from a plurality of reference signals, the reference signal to be supplied to the comparison unit; and a switching unit capable of switching a signal line connected to an input terminal of the comparison unit such that a signal line via which the reference signal selected by the selection unit is transmitted is connected to the input terminal of the comparison unit, wherein the comparison unit includes a floating node as the input terminal, the selection unit includes a signal line in which a parasitic capacitance is caused between the signal line and the floating node as the input terminal of the comparison unit, and the signal line of the selection unit is configured to transmit an identical level of signal in multiple comparison processes performed by the (Continued)

comparison unit. The present technology is applicable to, e.g., an imaging element and an electronic apparatus.

20 Claims, 22 Drawing Sheets

(51) Int. Cl.
    *H04N 5/378*         (2011.01)
    *H04N 5/374*         (2011.01)
    *H03M 1/12*          (2006.01)

(58) Field of Classification Search
    USPC .................................. 341/126–131; 348/294
    See application file for complete search history.

(56) References Cited

U.S. PATENT DOCUMENTS

2015/0029372 A1*   1/2015   Lee .................... H03M 1/36
                                                                         348/308
2015/0334331 A1*  11/2015   Yamashita ......... H04N 5/37455
                                                                          348/300
2017/0223292 A1*   8/2017   Ikeda ................ H04N 5/35563

* cited by examiner

SIGNAL PROCESSING DEVICE, IMAGING ELEMENT, AND ELECTRONIC APPARATUS

CROSS REFERENCE TO RELATED APPLICATIONS

This application is a U.S. National Phase of International Patent Application No. PCT/JP2015/079819 filed on Oct. 22, 2015, which claims priority benefit of Japanese Patent Application No. JP 2014-225188 filed in the Japan Patent Office on Nov. 5, 2014. Each of the above-referenced applications is hereby incorporated herein by reference in its entirety.

TECHNICAL FIELD

The present technology relates to a signal processing device, an imaging element, and an electronic apparatus. In particular, the present technology relates to a signal processing device, an imaging element, and an electronic apparatus configured so that a cost increase can be suppressed.

BACKGROUND ART

Typically in a general image sensor, electrical charge stored in a light receiving unit such as a photodiode is read as a signal, and then, analog/digital (A/D) conversion is performed for such a signal (see, e.g., Patent Document 1).

Such A/D conversion has been generally performed in such a manner that a signal read from a pixel having a light receiving unit is compared with a reference voltage such as a ramp wave and a time until such a comparison result changes is measured. In recent years, gradation enhancement in this A/D conversion has been demanded for image quality enhancement. Note that high-speed performance in processing and suppression of an increase in circuit dimensions and power consumption have been additionally demanded. For these reasons, Patent Document 1 describes a method in which two types of reference voltages with different gradients are prepared, a determination unit configured to determine the level of a pixel output signal is additionally provided, and either one of the two reference voltages is selected according to such a determination result such that the selected reference voltage is used for comparison with a signal read from a pixel.

Meanwhile, circuit miniaturization has been recently advanced for, e.g., size reduction and power consumption reduction. With circuit miniaturization, e.g., a distance between signal wirings is shortened, and this might lead to occurrence of a parasitic capacitance. For example, a case is conceivable, in which a control circuit for selecting a reference voltage is formed near an input terminal of a comparison unit configured to compare a signal read from a pixel with the reference voltage and a parasitic capacitance is caused between a wiring in the control circuit and the input terminal. In this case, the input terminal of the comparison unit as a series-capacitance floating node might be subjected to coupling due to signal transition of the wiring in the control circuit.

For example, in the case of performing correlated double sampling in A/D conversion, the signal level of a signal transmitted via the wiring in the control circuit might be different between a reset period and a signal reading period in correlated double sampling, and a fluctuation amount of a coupling voltage on the input terminal of the comparison unit in the reset period might be different from that in the signal reading period. With such a difference in the coupling voltage fluctuation amount between the reset period and the signal reading period, an error is caused in a correlated double sampling result due to the fluctuation amount difference, and as a result, there is a probability that A/D conversion cannot be accurately performed.

For reducing such an error, the parasitic capacitance may be reduced by a shield wiring provided with a fixed potential or a sufficient distance between wirings.

CITATION LIST

Patent Document

Patent Document 1: Japanese Patent Application Laid-Open No. 2011-41091

SUMMARY OF THE INVENTION

Problems to be Solved by the Invention

However, these methods might lead to a circuit area increase and a cost increase.

The present technology has been proposed in the view of the above-described situation, and is intended to suppress a cost increase.

Solutions to Problems

An aspect of the present technology is a signal processing device including: a comparison unit configured to compare a signal level of an analog signal with a signal level of a reference signal; a selection unit configured to select, from a plurality of reference signals, the reference signal to be supplied to the comparison unit; and a switching unit capable of switching a signal line connected to an input terminal of the comparison unit such that a signal line via which the reference signal selected by the selection unit is transmitted is connected to the input terminal of the comparison unit, wherein the comparison unit includes a floating node as the input terminal, the selection unit includes a signal line in which a parasitic capacitance is caused between the signal line and the floating node as the input terminal of the comparison unit, and the signal line of the selection unit is configured to transmit an identical level of signal in multiple comparison processes performed by the comparison unit.

The comparison unit sequentially may compare a signal level of a reset signal read from a unit pixel with each signal level of the plurality of reference signals, the selection unit may select anyone of the plurality of reference signals according to a signal level of a pixel signal read from the unit pixel, the switching unit may switch, as necessary, the signal line connected to the input terminal of the comparison unit such that the signal line via which the reference signal selected by the selection unit is transmitted is connected to the input terminal of the comparison unit, the comparison unit may further compare the signal level of the pixel signal with the signal level of the reference signal selected by the selection unit, and the signal line of the selection unit may transmit the identical level of signal in both of comparison, by the comparison unit, between the signal level of the reset signal and the signal level of the reference signal selected by the selection unit and comparison between the signal level of the pixel signal and the signal level of the reference signal by the comparison unit.

A signal level of the signal transmitted via the signal line of the selection unit may indicate the reference signal selected by the selection unit.

The comparison unit may be initialized, sequentially compare a signal level of a reset signal read from a unit pixel with each signal level of the plurality of reference signals, and compare a signal level of a pixel signal read from the unit pixel with a signal level of a predetermined reference signal, the selection unit may select anyone of the plurality of reference signals on the basis of a result of comparison between the signal level of the pixel signal and the signal level of the predetermined reference signal by the comparison unit, the switching unit may switch, as necessary, the signal line connected to the input terminal of the comparison unit such that the signal line via which the reference signal selected by the selection unit is transmitted is connected to the input terminal of the comparison unit, the comparison unit may further compare the signal level of the pixel signal with the signal level of the reference signal selected by the selection unit, and the signal line of the selection unit may transmit the identical level of signal in both of initialization of the comparison unit and comparison between the signal level of the pixel signal and the signal level of the predetermined reference signal by the comparison unit.

A signal level of the signal transmitted via the signal line of the selection unit may indicate the reference signal selected by the selection unit.

The selection unit may select, from the plurality of reference signals, the reference signal to be supplied to the comparison unit on the basis of a result of comparison performed by the comparison unit.

A measurement unit configured to measure a time until a result of comparison performed by the comparison unit changes and output a measurement result as an A/D conversion result of the analog signal may further be included.

The comparison unit may compare the signal level of the reference signal with the signal level of the analog signal read from a unit pixel of a pixel array belonging to a unit pixel group assigned to the comparison unit itself.

In addition, an aspect of the present technology is an imaging element including: a pixel array configured such that unit pixels are arranged in a matrix; a comparison unit configured to compare a signal level of an analog signal read from each unit pixel of the pixel array with a signal level of a reference signal; a selection unit configured to select, from a plurality of reference signals, the reference signal to be supplied to the comparison unit; and a switching unit capable of switching a signal line connected to an input terminal of the comparison unit such that a signal line via which the reference signal selected by the selection unit is transmitted is connected to the input terminal of the comparison unit, wherein the comparison unit includes a floating node as the input terminal, the selection unit includes a signal line in which a parasitic capacitance is caused between the signal line and the floating node as the input terminal of the comparison unit, and the signal line of the selection unit is configured to transmit an identical level of signal in multiple comparison processes performed by the comparison unit.

Furthermore, an aspect of the present technology is an electronic apparatus including: an imaging unit configured to obtain an image of an object; and an image processing unit configured to process image data obtained by imaging of the imaging unit, wherein the imaging unit includes a pixel array configured such that unit pixels are arranged in a matrix, a comparison unit configured to compare a signal level of an analog signal read from each unit pixel of the pixel array with a signal level of a reference signal, a selection unit configured to select, from a plurality of reference signals, the reference signal to be supplied to the comparison unit, and a switching unit capable of switching a signal line connected to an input terminal of the comparison unit such that a signal line via which the reference signal selected by the selection unit is transmitted is connected to the input terminal of the comparison unit, wherein the comparison unit includes a floating node as the input terminal, the selection unit includes a signal line in which a parasitic capacitance is caused between the signal line and the floating node as the input terminal of the comparison unit, and the signal line of the selection unit is configured to transmit an identical level of signal in multiple comparison processes performed by the comparison unit.

Another aspect of the present technology is a signal processing device including: a comparison unit configured to compare a signal level of an analog signal with a signal level of a reference signal; a selection unit configured to select, from a plurality of reference signals, the reference signal to be supplied to the comparison unit; a switching unit capable of switching a signal line connected to the comparison unit such that a signal line via which the reference signal selected by the selection unit is transmitted is connected to the comparison unit; a mixing unit configured to mix a signal indicating a comparison result obtained by the comparison unit with a signal indicating the reference signal selected by the selection unit; a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line; and a control unit configured to control measurement of the measurement unit on the basis of the signal indicating the reference signal selected by the selection unit, the signal being contained in the signal output from the mixing unit and transmitted via the single signal line.

The mixing unit may transmit, via the single signal line, the signal indicating the comparison result obtained by the comparison unit and the signal indicating the reference signal selected by the selection unit in different periods.

The comparison unit may sequentially compare a signal level of a reset signal read from a unit pixel with each signal level of the plurality of reference signals, and compare a signal level of a pixel signal read from the unit pixel with a signal level of a predetermined reference signal, the selection unit may select any one of the plurality of reference signals, the switching unit may switch, as necessary, the signal line connected to the comparison unit such that the signal line via which the reference signal selected by the selection unit is transmitted is connected to the comparison unit, the comparison unit may further compare the signal level of the pixel signal with the signal level of the reference signal selected by the selection unit, and the mixing unit may transmit, via the single signal line, the signal indicating the comparison result in a period for comparing the signal level of the reset signal with the signal level of each reference signal by the comparison unit, transmit, via the single signal line, the signal indicating the reference signal selected by the selection unit in a period for comparing the signal level of the pixel signal with the signal level of the predetermined reference signal by the comparison unit, and transmit, via the single signal line, the signal indicating the comparison result in a period for comparing, by the comparison unit, the signal level of the pixel signal with the signal level of the reference signal selected by the selection unit.

The comparison unit may include a signal comparison unit configured to compare the signal level of the analog signal with the signal level of the reference signal, a logical NOT unit configured to invert a comparison result obtained by the signal comparison unit, and a logical NAND unit configured to obtain a logical NAND of output of the logical NOT unit and a predetermined control signal, and the mixing unit may mix output of the logical NAND unit with the signal indicating the reference signal selected by the selection unit.

The comparison unit may include a signal comparison unit configured to compare the signal level of the analog signal with the signal level of the reference signal, and a logical NOT unit configured to invert a comparison result obtained by the signal comparison unit, and the mixing unit may include a logical AND unit configured to obtain a logical AND of output of the logical NOT unit and a predetermined control signal, and a logical NOR unit configured to obtain a logical NOR of output of the logical AND unit and the signal indicating the reference signal selected by the selection unit.

The selection unit may select, from the plurality of reference signals, the reference signal to be supplied to the comparison unit according to the comparison result obtained by the comparison unit.

The comparison unit may compare the signal level of the reference signal with the signal level of the analog signal read from a unit pixel of a pixel array belonging to a unit pixel group assigned to the comparison unit itself.

The comparison unit, the selection unit, the switching unit, and the mixing unit may be formed on a semiconductor substrate different from that for the measurement unit and the control unit.

In addition, another aspect of the present technology is an imaging element including: a pixel array configured such that unit pixels are arranged in a matrix; a comparison unit configured to compare a signal level of an analog signal read from each unit pixel of the pixel array with a signal level of a reference signal; a selection unit configured to select, from a plurality of reference signals, the reference signal to be supplied to the comparison unit; a switching unit capable of switching a signal line connected to the comparison unit such that a signal line via which the reference signal selected by the selection unit is transmitted is connected to the comparison unit; a mixing unit configured to mix a signal indicating a comparison result obtained by the comparison unit with a signal indicating the reference signal selected by the selection unit; a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line; and a control unit configured to control measurement of the measurement unit on the basis of the signal indicating the reference signal selected by the selection unit, the signal being contained in the signal output from the mixing unit and transmitted via the single signal line.

Furthermore, another aspect of the present technology is an electronic apparatus including: an imaging unit configured to obtain an image of an object; and an image processing unit configured to process image data obtained by imaging of the imaging unit, wherein the imaging unit includes a pixel array configured such that unit pixels are arranged in a matrix, a comparison unit configured to compare a signal level of an analog signal read from each unit pixel of the pixel array with a signal level of a reference signal, a selection unit configured to select, from a plurality of reference signals, the reference signal to be supplied to the comparison unit, and a switching unit capable of switching a signal line connected to the comparison unit such that a signal line via which the reference signal selected by the selection unit is transmitted is connected to the comparison unit, a mixing unit configured to mix a signal indicating a comparison result obtained by the comparison unit with a signal indicating the reference signal selected by the selection unit, a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line, and a control unit configured to control measurement of the measurement unit on the basis of the signal indicating the reference signal selected by the selection unit, the signal being contained in the signal output from the mixing unit and transmitted via the single signal line.

In an aspect of the present technology, the following units are provided: a comparison unit configured to compare the signal level of an analog signal with the signal level of a reference signal; a selection unit configured to select, from a plurality of reference signals, the reference signal to be supplied to the comparison unit; and a switching unit capable of switching a signal line connected to an input terminal of the comparison unit such that a signal line via which the reference signal selected by the selection unit is transmitted is connected to the input terminal of the comparison unit. The comparison unit includes a floating node as the input terminal. A signal line of the selection unit in which a parasitic capacitance is caused between the signal line and the input terminal of the comparison unit is configured to transmit the same level of signal in multiple comparison processes performed by the comparison unit.

In another aspect of the present technology, the following units are provided: a comparison unit configured to compare the signal level of an analog signal with the signal level of a reference signal; a selection unit configured to select, from a plurality of reference signals, the reference signal to be supplied to the comparison unit; a switching unit capable of switching a signal line connected to the comparison unit such that a signal line via which the reference signal selected by the selection unit is transmitted is connected to the comparison unit; a mixing unit configured to mix a signal indicating a comparison result obtained by the comparison unit with a signal indicating the reference signal selected by the selection unit; a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line; and a control unit configured to control measurement of the measurement unit on the basis of the signal indicating the reference signal selected by the selection unit, the signal being contained in the signal output from the mixing unit and transmitted via the single signal line.

Effects of the Invention

According to the present technology, a signal can be processed. Moreover, according to the present technology, a cost increase can be suppressed.

MODE FOR CARRYING OUT THE INVENTION

Modes (hereinafter referred to as "embodiments") for carrying out the present disclosure will be described below. Note that description will be made in the following order:
1. First Embodiment (Image Sensor);
2. Second Embodiment (Image Sensor);
3. Third Embodiment (Image Sensor);
4. Fourth Embodiment (Image Sensor); and
5. Fifth Embodiment (Imaging Device).
<1. First Embodiment>
<Parasitic Capacitance and Coupling Voltage Fluctuation>

Typically, a general image sensor has been configured to read, as a signal, electrical charge stored in a light receiving unit such as a photodiode to perform analog/digital (A/D) conversion of the electrical charge. Such A/D conversion has been generally performed in such a manner that a signal read from a pixel having the light receiving unit is compared with a reference voltage such as a ramp wave and a time until such a comparison result changes is measured.

Gradation enhancement of the image sensor is one type of performance required for image quality enhancement. In particular, gradation enhancement in a low-illuminance region greatly contributes to an image quality. Generally, in the case of enhancing a gradation, such enhancement sacrifices high-speed performance, an area, and power consumption. Due to gradation enhancement, the number of A/D conversion processes increases, and this might lead to lowering of the high-speed performance. Further, when a plurality of A/D conversion units are used to perform parallel processing to maintain the high-speed performance, this might lead to an increase in the area and the power consumption. With an increase in the area of the A/D conversion units, a semiconductor substrate becomes larger, and this might lead to an increase in a manufacturing cost. In addition, due to an increase in the area of the A/D conversion units, designing becomes more difficult, and this might lead to an increase in a development cost.

In recent years, not only gradation enhancement in A/D conversion but also high-speed processing and suppression of an increase in the area and the power consumption have been demanded, for example. Thus, as described in, e.g., Patent Document 1, a method is conceivable, in which two types of reference voltages with different gradients are prepared, a determination unit configured to determine the level of a pixel output signal is additionally provided, and either one of the two reference voltages is selected according to such a determination result such that the selected reference voltage is used for comparison with a signal read from a pixel.

Figure 1:
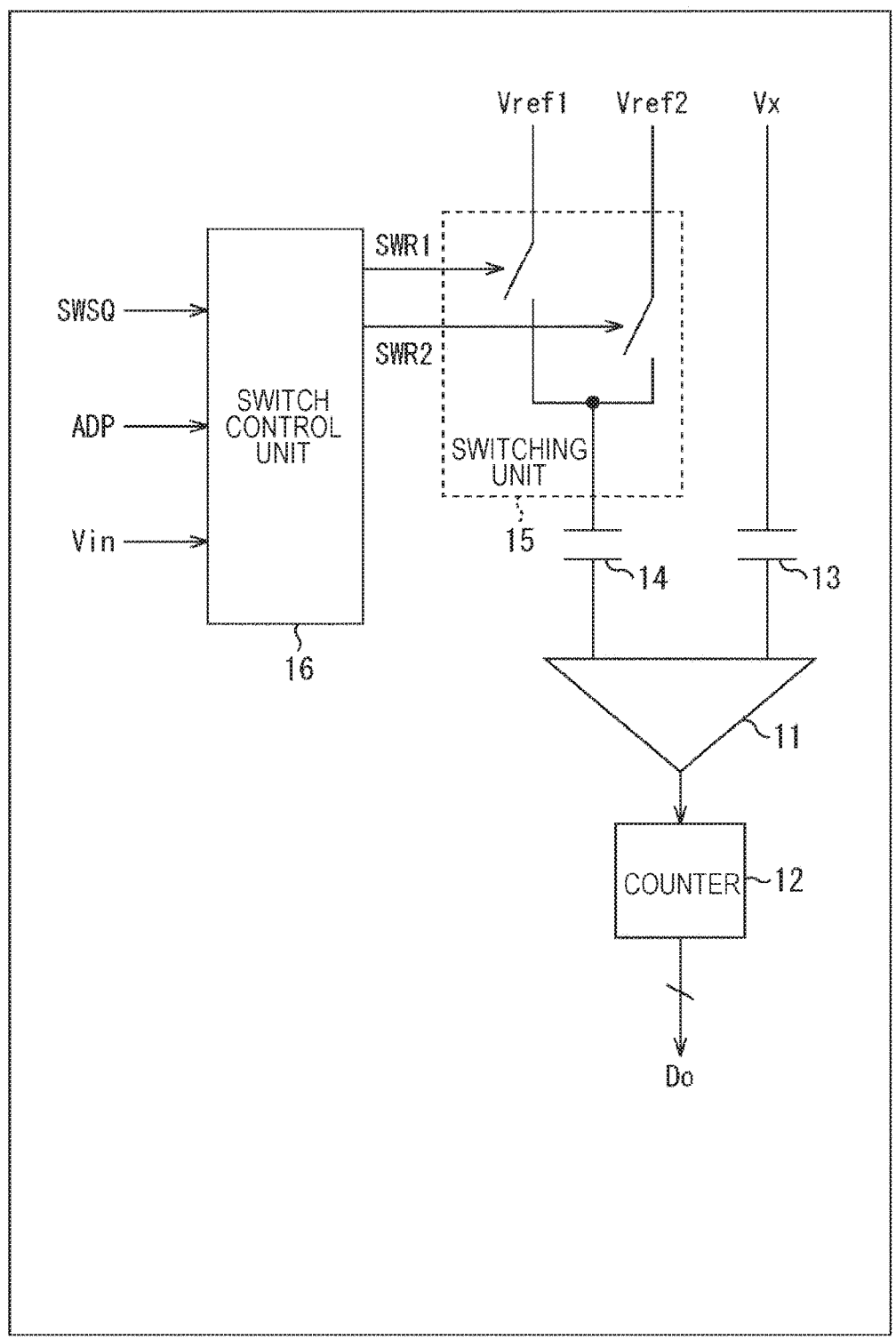
FIG. 1 is a diagram of a main configuration example of an A/D conversion unit.

FIG. 1 is a block diagram of a main configuration example of an A/D conversion unit configured to perform A/D conversion in the above-described method. In the A/D conversion unit illustrated in FIG. 1, a comparison unit 11 is configured to compare a signal Vx as an analog signal with a reference signal Vref1 or a reference signal Vref2 (also referred to as a "reference voltage") whose voltage fluctuates within a predetermined range, such as a ramp wave. A counter 12 is configured to count a time (e.g., a clock number) until a value of the comparison result changes after the start of counting. Such a count value indicates a time (a clock number) until the signal level of the reference signal Vref1 or the reference signal Vref2 reaches the signal level of the signal Vx from a minimum value or a maximum value. That is, the count value is digital data indicating the signal level of the signal Vx. Thus, the counter 12 outputs the count value Do as the A/D conversion result of the signal Vx.

As illustrated in FIG. 1, a capacitor 13 is connected in series with an input terminal of the comparison unit 11 to which the signal Vx is input. Similarly, a capacitor 14 is connected in series with an input terminal of the comparison unit 11 to which the reference signal Vref1 or the reference signal Vref2 is input. That is, each input terminal of the comparison unit 11 forms a floating node.

Moreover, a switching unit 15 capable of switching the reference signal to be input to the comparison unit 11 is connected in series with the capacitor 14. The switching unit 15 includes a switch configured to control connection between a signal line via which the reference signal Vref1 is transmitted and a signal line connected to the capacitor 14, and a switch configured to control connection between a signal line via which the reference signal Vref2 is transmitted and the signal line connected to the capacitor 14. The switching unit 15 turns on (ON) either one of the switches and turns off (OFF) the other one of the switches, thereby inputting either one of the reference signal Vref1 and the reference signal Vref2 to the comparison unit 11. The switching unit 15 performs such switching operation on the basis of control by a switch control unit 16, i.e., values of a control signal SWR1 and a control signal SWR2 from the switch control unit 16.

The switch control unit 16 is configured to determine the values of the control signal SWR1 and the control signal SWR2 on the basis of values of a predetermined control signal SWSQ, a predetermined control signal ADP, and a predetermined signal Vin, thereby supplying the control signal SWR1 and the control signal SWR2 to control the switching unit 15. For example, in the case of the method described in Patent Document 1, the signal Vx is, as the signal Vin, input to the switch control unit 16, and the switching unit 15 is controlled according to the signal level of the signal Vx (i.e., the reference signal is selected).

The reference signal Vref1 and the reference signal Vref2 are different from each other in a voltage change speed (i.e., a signal gradient). Thus, the A/D conversion unit as illustrated in FIG. 1 differently uses these reference signals according to the signal level of the signal Vx (i.e., an illuminance) (the A/D conversion unit switches the accuracy of the reference signal) so that a gradation in the low-illuminance region can be enhanced while a gradation in a high-illuminance region is maintained. Moreover, since the switching unit performs switching of the reference signal, it is not necessary to perform the parallel processing using the plurality of A/D conversion units. Thus, an increase in the area and the power consumption can be suppressed.

Figure 2:
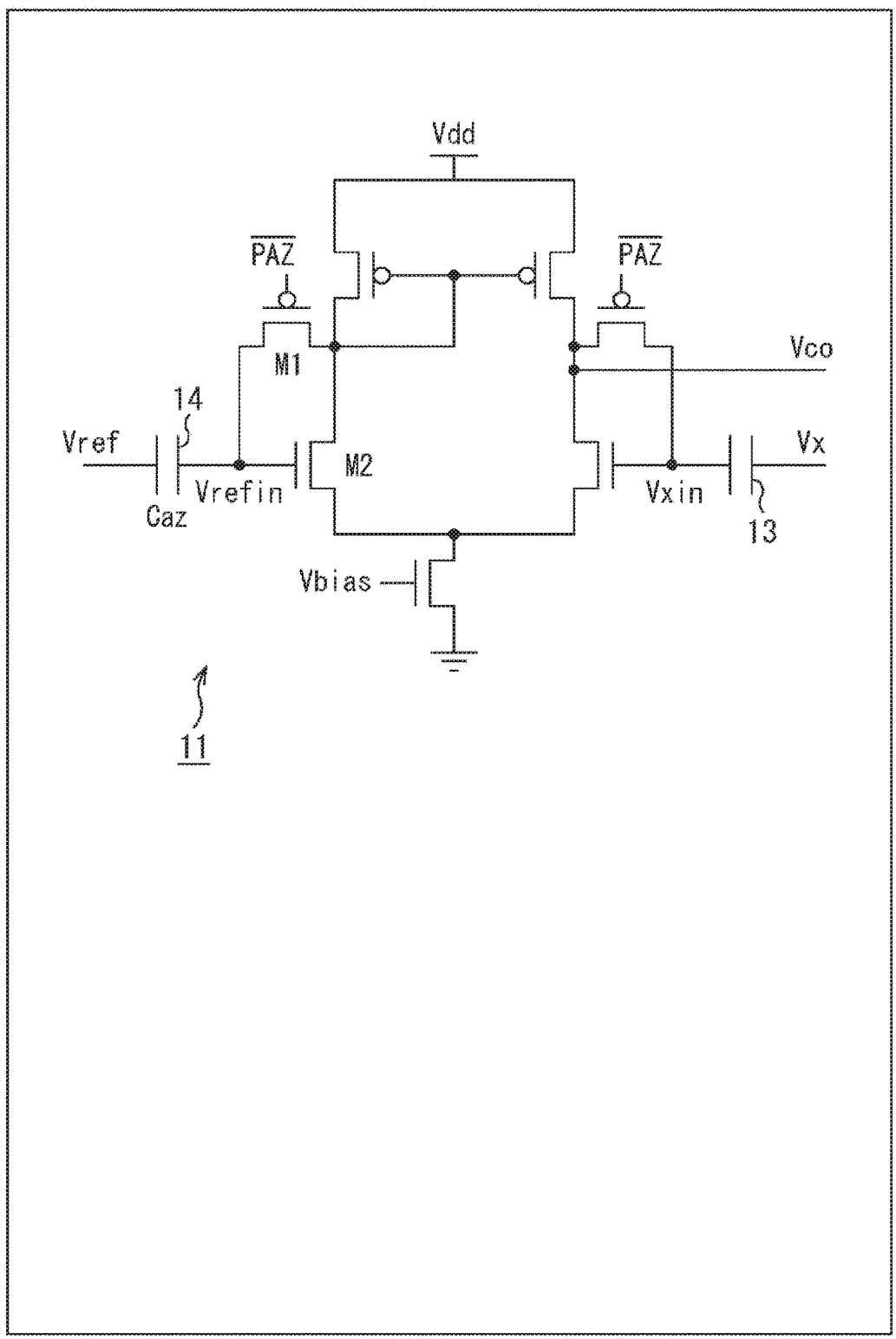
FIG. 2 is a diagram of a main configuration example of a comparison unit.

The comparison unit 11 has a configuration as in an example illustrated in FIG. 2, for example. As illustrated in FIG. 2, the capacitor 13 is connected in series with an input terminal Vxin of the comparison unit 11 to which the signal Vx is input, and the capacitor 14 is connected in series with an input terminal Vrefin of the comparison unit 11 to which the reference signal Vref1 or the reference signal Vref2 is input. Thus, the input terminal Vxin and the input terminal Vrefin are floating nodes.

Figures 3A, 3B:
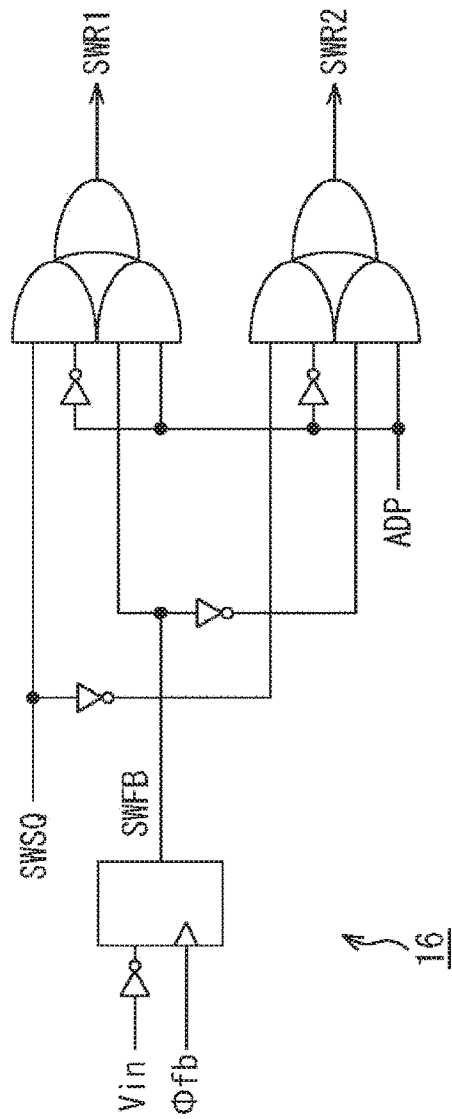
FIGS. 3A and 3B are diagrams of a main configuration example of a switch control unit.

Meanwhile, the switch control unit 16 has a configuration as in an example illustrated in FIG. 3A. The values of the control signal SWR1 and the control signal SWR2 are, as in an example shown in FIG. 3B, determined according to the control signal ADP and the control signal SWSQ. More specifically, when the control signal ADP is "1," the value of the control signal SWR1 is a value of a signal SWFB, and the value of the control signal SWR2 is the value of the signal SWFB. As illustrated in FIG. 3A, the signal SWFB is an internal signal of the switch control unit 16, and is determined according to the signal Vin. More specifically, the signal SWFB is denial of the signal Vin latched at predetermined timing controlled according to a signal Φfb.

Figure 4:
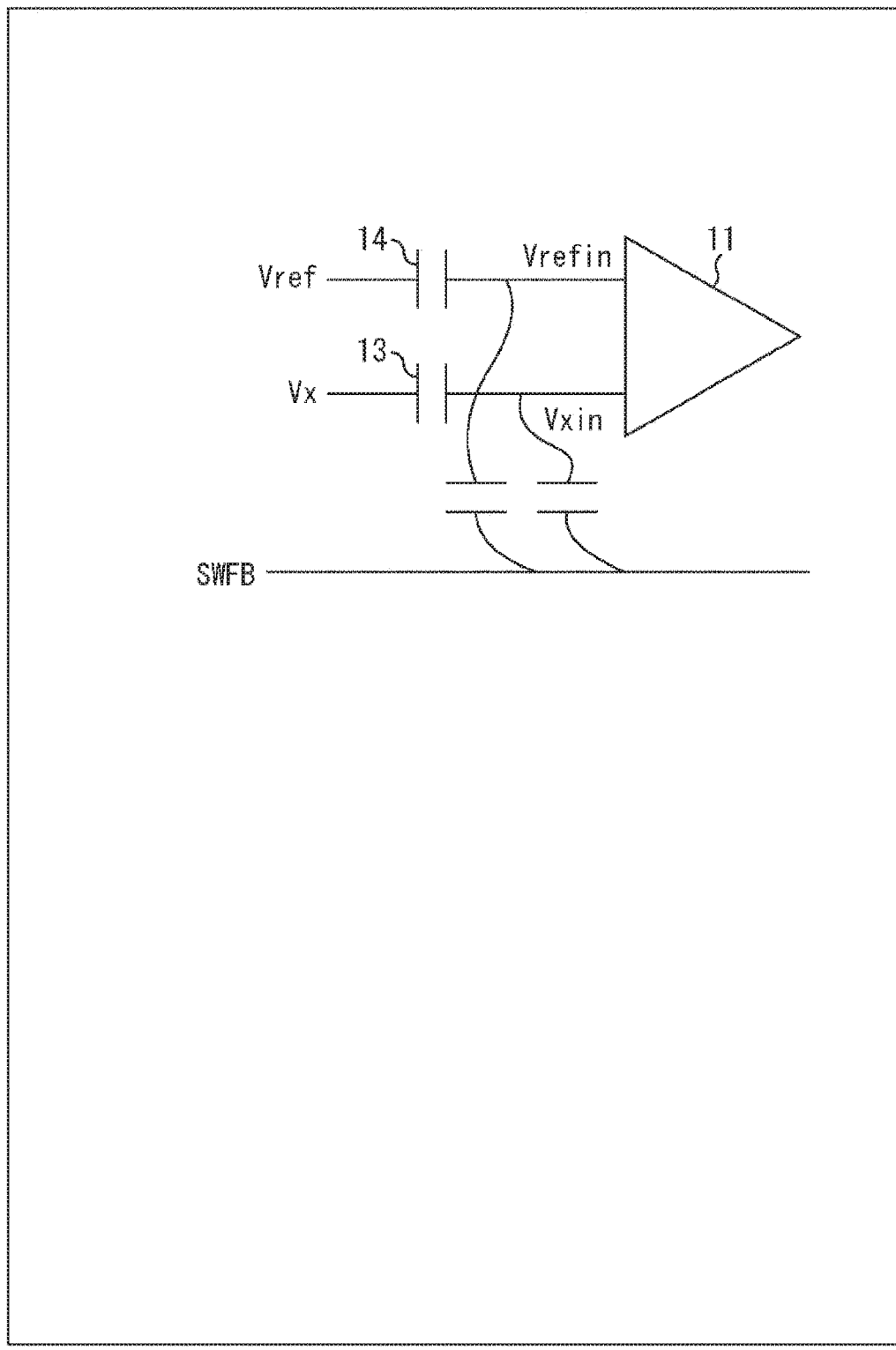
FIG. 4 is a diagram for describing a parasitic capacitance.

With more circuit miniaturization, a distance between signal lines in a circuit is shortened. In the case of A/D conversion of FIG. 1, a distance between the comparison unit 11 and the switch control unit 16 is shortened. As in an example illustrated in FIG. 4, there is a probability that a parasitic capacitance is caused between each floating node (Vrefin and Vxin) of the comparison unit 11 and a signal line via which the signal SWFB of the switch control unit 16 is transmitted. With such a parasitic capacitance, the floating node of the comparator might be subjected to coupling due to signal transition of the value of the signal SWFB (e.g., an illuminance determination result).

Figure 5:
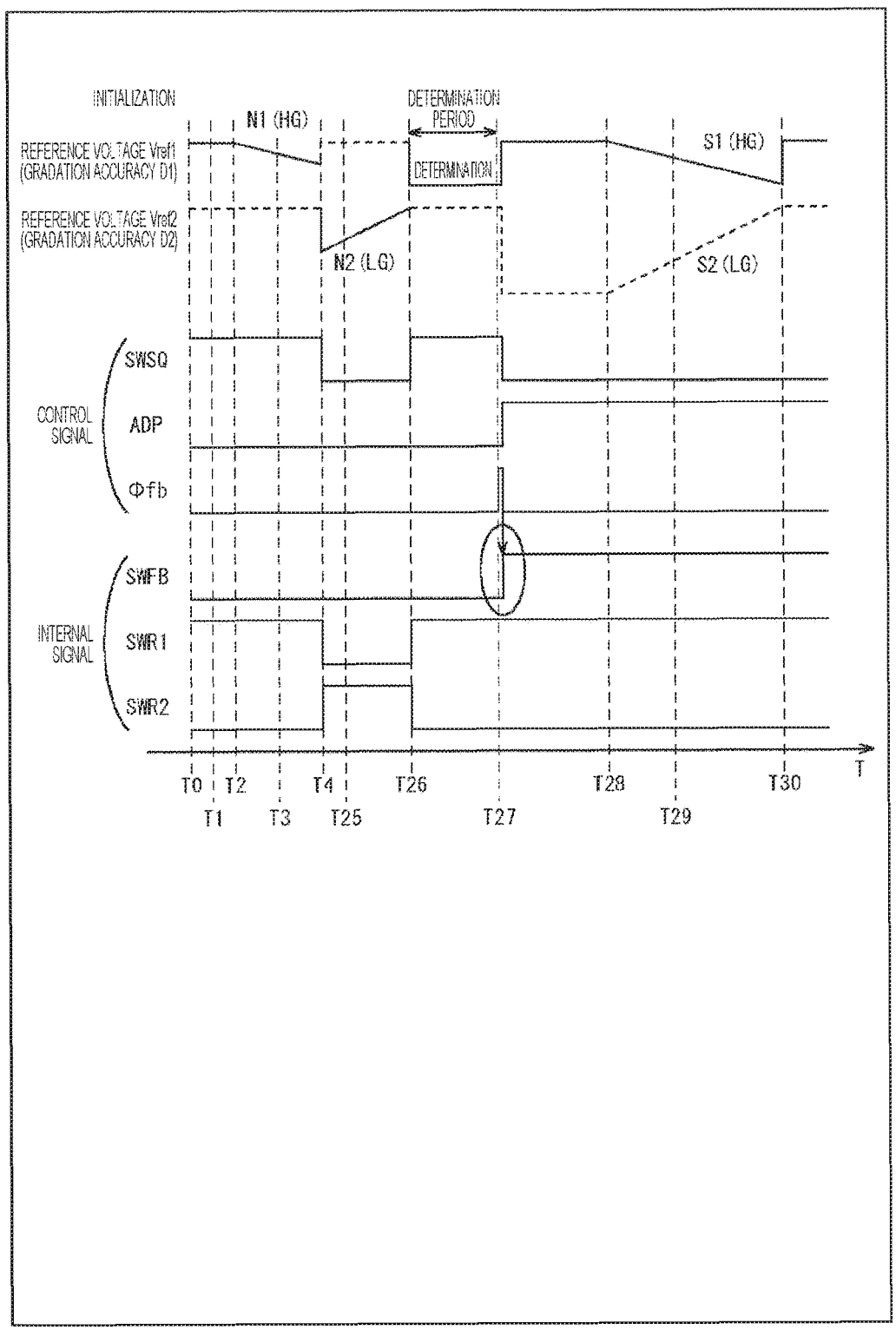
FIG. 5 is a timing chart for describing an example of an internal signal of the switch control unit.

For example, in A/D conversion, the A/D conversion unit of FIG. 1 performs, as in a timing chart illustrated in FIG. 5, the following A/D conversion processes in a reset period of correlated double sampling (CDS): A/D conversion (N1) of the signal Vx using the reference voltage Vref1 with a gradation accuracy D1; and A/D conversion (N2) of the signal Vx (a reset signal) using the reference voltage Vref2 with a gradation accuracy D2. Then, the A/D conversion unit determines the signal level of the signal Vx. On the basis of such a determination result, either one of A/D conversion (S1) of the signal Vx (a pixel signal) using the reference voltage Vref1 and A/D conversion (S2) of the signal Vx (the pixel signal) using the reference voltage Vref2 is performed in a CDS signal reading period.

In this case, after determination of the signal level of the signal Vx (a time point T27), a pulse of Φfb is generated, and a signal to be latched is updated. That is, depending on the value of the signal Vin, such updating might change the value of the signal SWFB. When the value of the signal SWFB changes as described above, a fluctuation amount of a coupling voltage on the floating node of the comparison unit 11 varies between the reset period and the signal reading period. For this reason, there is a probability that an error corresponding to such coupling voltage fluctuation is caused in a CDS result.

Examples of the method for reducing such an error include a method in which the parasitic capacitance is reduced by a shield wiring provided between the signal line via which the signal SWFB is transmitted and each floating node of the comparison unit 11 or by a layout made with a sufficient distance therebetween.

However, in the case of these methods, there is a probability that the circuit area of the A/D conversion unit increases. With an increase in the circuit area of the A/D conversion unit, the semiconductor substrate on which the circuit of the A/D conversion unit is disposed needs to be expanded by such an increase. This might lead to an increase in the manufacturing cost. Moreover, with an increase in the circuit area of the A/D conversion unit, designing of the image sensor becomes more difficult by such an increase. This might also lead to an increase in the development cost. In addition, the power consumption might increase with an increase in circuit dimensions.

<Control of Signal SWFB>

For the above-described reasons, a signal line which is included in a selection unit configured to select, from the plurality of reference signals, the reference signal to be supplied to the comparison unit and in which the parasitic capacitance is caused between the signal line and the input terminal as the floating node of the comparison unit is configured to transmit the same level of signal in each of multiple comparison processes performed by the comparison unit. For example, in the case of performing A/D conversion as in an example of FIG. 5, the value of the signal SWFB is set identical between both comparison processes in the CDS reset period and the CDS signal reading period as illustrated in FIGS. 6A and 6B.

Note that in the present technology, the same reference signal is used for each of the multiple comparison processes. For example, in the case of the example of FIG. 5, the comparison processes are sequentially performed using each reference signal in the CDS reset period, whereas only one of such comparison processes is performed in the CDS signal reading period. In this case, the value of the signal SWFB in one, using the same reference signal as that used for comparison in the signal reading period, of the comparison processes in the reset period is the same as that in comparison in the signal reading period.

Figure 6A:
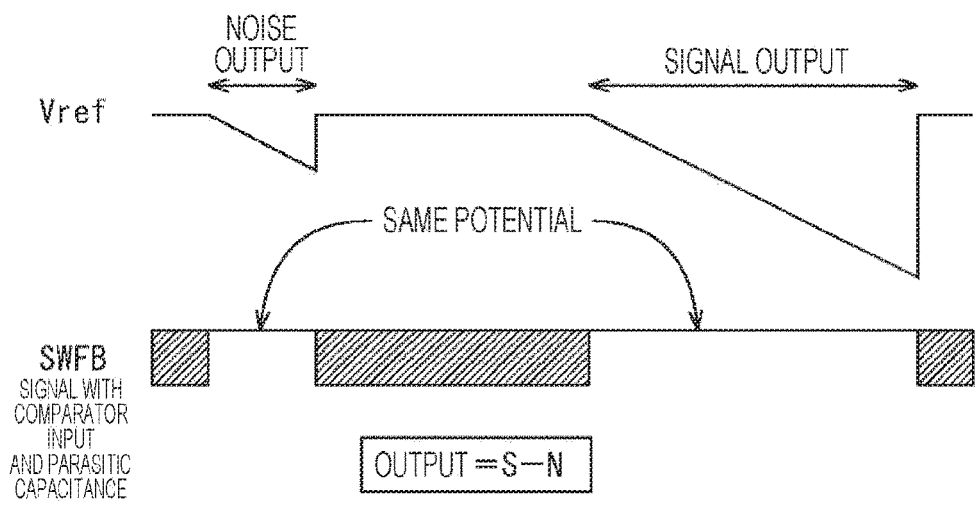
FIGS. 6A and 6B are timing charts for describing another example of the internal signal of the switch control unit.

FIG. 6A illustrates an example of the signal SWFB when the reference signal Vref1 with a high-gain slope and the signal Vx are compared with each other in the signal reading period. In this case, the value of the signal SWFB is "H" in both of comparison between the reference signal Vref1 and the signal Vx in the reset period and comparison between the reference signal Vref1 and the signal Vx in the signal reading period.

Figure 6B:
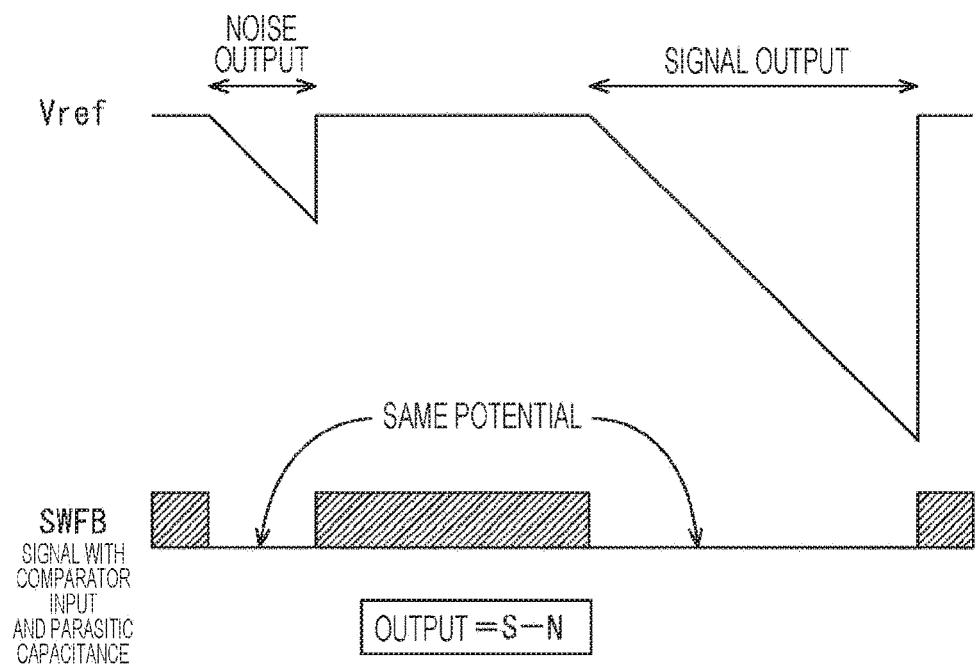

FIG. 6B illustrates an example of the signal SWFB when the reference signal Vref2 with a low-gain slope and the signal Vx are compared with each other in the signal reading period. In this case, the value of the signal SWFB is "L" in both of comparison between the reference signal Vref2 and the signal Vx in the reset period and comparison between the reference signal Vref2 and the signal Vx in the signal reading period.

As described above, since the potential of the signal SWFB transmitted via the signal line in which the parasitic capacitance is caused between the signal line and the input terminal as the floating node of the comparison unit 11 is the same between both of the reset period and the signal reading period, the coupling voltage fluctuation amount is constant. Thus, the error in the correlated double sampling result can be reduced. That is, the error can be reduced without increasing the circuit area of the A/D conversion unit, leading to more accurate A/D conversion. Thus, an increase in the development and manufacturing costs can be suppressed. Further, an increase in the power consumption can be also suppressed.

<Image Sensor>

Figure 7:
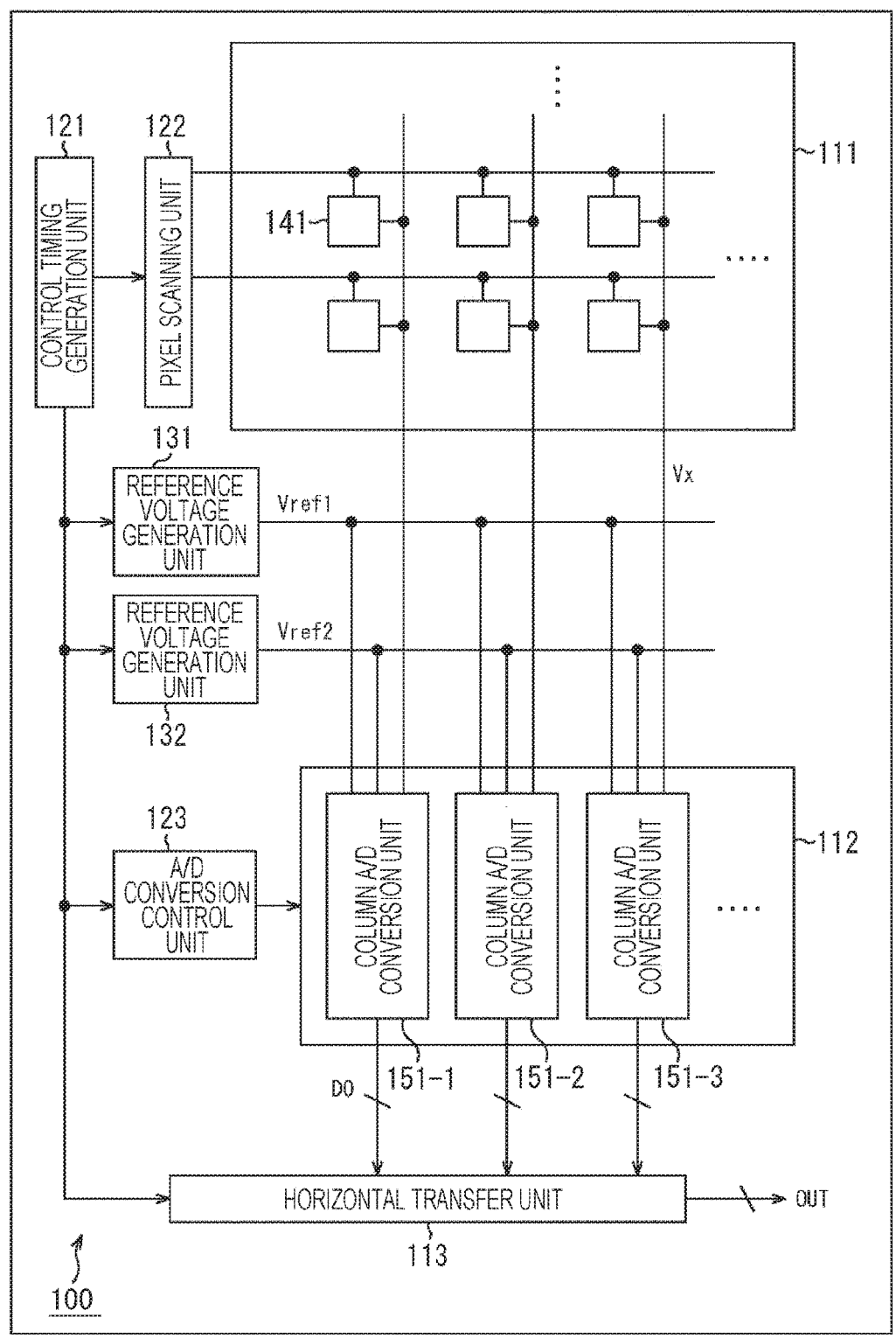
FIG. 7 is a diagram of a main configuration example of an image sensor.

A main configuration example of the image sensor as one embodiment of an imaging element (a signal processing device) to which the present technology is applied is illustrated in FIG. 7. An image sensor 100 illustrated in FIG. 7 is a device configured to photoelectrically convert light from an object into image data to output the image data. For example, the image sensor 100 is configured as a complementary metal oxide semiconductor (CMOS) image sensor using a CMOS or a charge coupled device (CCD) image sensor using a CCD.

As illustrated in FIG. 7, the image sensor 100 includes a pixel array 111, an A/D conversion unit 112, and a horizontal transfer unit 113. The image sensor 100 further includes a control timing generation unit 121, a pixel scanning unit 122, and an A/D conversion control unit 123. The image sensor 100 still further includes a reference voltage generation unit 131 and a reference voltage generation unit 132.

The pixel array 111 is a pixel region in which pixel configurations (unit pixels) each having a photoelectric conversion element such as a photodiode are arranged in a planer shape or a curved shape. In the case of an example of FIG. 7, unit pixels 141 are arranged in a matrix (an array). The pattern for arranging the unit pixels 141 is optional, and for example, the unit pixels 141 maybe arranged in other patterns than the matrix, such as a so-called honeycomb structure.

As illustrated in FIG. 7, a vertical signal line is formed for each column (hereinafter sometimes referred to as a "unit pixel column") of the unit pixels 141. Each vertical signal line is connected to each unit pixel of a corresponding column (a corresponding unit pixel column), and is configured to transmit, to the A/D conversion unit 112, a signal (e.g., the pixel signal Vx) read from each unit pixel. Moreover, as illustrated in FIG. 7, a control line is formed for each row (hereinafter sometimes referred to as a "unit pixel row") of the unit pixels 141. Each control line is connected to each unit pixel of a corresponding unit pixel row, and is configured to transmit, to each unit pixel, a control signal supplied from the pixel scanning unit 122.

That is, each unit pixel 141 is connected to the vertical signal line assigned to the column (the unit pixel column) to which such a unit pixel 141 belongs and the control line assigned to the unit pixel row to which such a unit pixel 141 belongs. Each unit pixel 141 is driven on the basis of the control signal supplied via the control line, and supplies, via the vertical signal line, the A/D conversion unit 112 with an electric signal obtained by such a unit pixel 141 itself.

The reference voltage generation unit 131 is configured to generate the reference signal Vref1 (also referred to as the reference voltage Vref1) as a reference signal for A/D conversion with a predetermined gradation accuracy by the A/D conversion unit 112. The waveform of the reference signal Vref1 is optional. For example, the reference signal Vref1 may be a ramp wave (a saw tooth wave). An example where the ramp wave (Ramp) is used as the reference signal Vref1 will be described below. The reference voltage generation unit 131 includes, for example, a D/A conversion unit, and such a D/A conversion unit is configured to generate the reference signal (Ramp). The reference signal (Ramp) is supplied to the A/D conversion unit 112 via a reference signal line.

The reference voltage generation unit 132 is configured to generate the reference signal Vref2 (also referred to as the reference voltage Vref2) as a reference signal for A/D conversion with a predetermined gradation accuracy by the A/D conversion unit 112. The reference signal Vref2 is a reference signal for A/D conversion with a different gradation accuracy from that of the reference signal Vref1. As long as the waveform of the reference signal Vref2 is the same type as that of the reference signal Vref1, the waveform of the reference signal Vref2 is optional. For example, when the reference signal Vref1 is the ramp wave (the saw tooth wave), the reference signal Vref2 is also a ramp wave (a saw tooth wave). Note that a slope gradient is different between these signals. The reference voltage generation unit 132 includes, for example, a D/A conversion unit, and such a D/A conversion unit is configured to generate the reference signal (Ramp). The reference signal (Ramp) is supplied to the A/D conversion unit 112 via a reference signal line.

In description made below, the reference signal Vref1 and the reference signal Vref2 are the ramp waves (Ramp), the reference signal Vref1 is a reference signal with a high-gain slope for A/D conversion for low-illuminance (high-accuracy) determination, and the reference signal Vref2 is a reference signal with a low-gain slope for A/D conversion for high-illuminance (low-accuracy) determination (i.e., a reference signal with a slope gradient sharper than that of the reference signal Vref1).

The A/D conversion unit 112 is configured to A/D convert, using the reference signal, the signal Vx as the analog signal (read from each unit pixel) transmitted from the pixel array 111 via the vertical signal line, thereby outputting such digital data (digital output DO) to the horizontal transfer unit 113.

The A/D conversion unit 112 includes a column A/D conversion unit 151 for each column (each unit pixel column) of the pixel array 111, such as a column A/D conversion unit 151-1, a column A/D conversion unit 151-2, a column A/D conversion unit 151-3, . . . as illustrated in FIG. 7.

Each column A/D conversion unit 151 is connected to the vertical signal line of a corresponding column, the reference signal line via which the reference signal Vref1 is transmitted, and the reference signal line via which the reference signal Vref2 is transmitted. Each column A/D conversion unit 151 is configured to use the reference signal Vref1 or the reference signal Vref2 to A/D convert the signal Vx for a corresponding column.

Moreover, each column A/D conversion unit 151 is connected to a signal line connected to the horizontal transfer unit 113. Each column A/D conversion unit 151 is configured to supply, via such a signal line, the horizontal transfer unit 113 with the digital output DO as the digital data indicating an A/D conversion result obtained by such a column A/D conversion unit 151 itself.

The horizontal transfer unit 113 is configured to transfer, to the outside of the image sensor 100, the digital data (output OUT) supplied from the A/D conversion unit 112, for example.

The control timing generation unit 121 is configured to supply predetermined clock signals to the pixel scanning unit 122, the A/D conversion control unit 123, the reference voltage generation unit 131, the reference voltage generation unit 132, and the horizontal transfer unit 113, thereby controlling drive timing of these units.

The pixel scanning unit 122 is configured to supply, via the control line, each unit pixel row of the pixel array 111 with the control signal, thereby controlling operation of a transistor of each unit pixel 141. The A/D conversion control unit 123 is configured to supply a control signal via a control line, thereby controlling operation of the A/D conversion unit 112 (each column A/D conversion unit 151).

Note that each control line is illustrated as a single line in FIG. 7, but may include a plurality of control lines.

<Unit Pixel Configuration>

Figure 8:
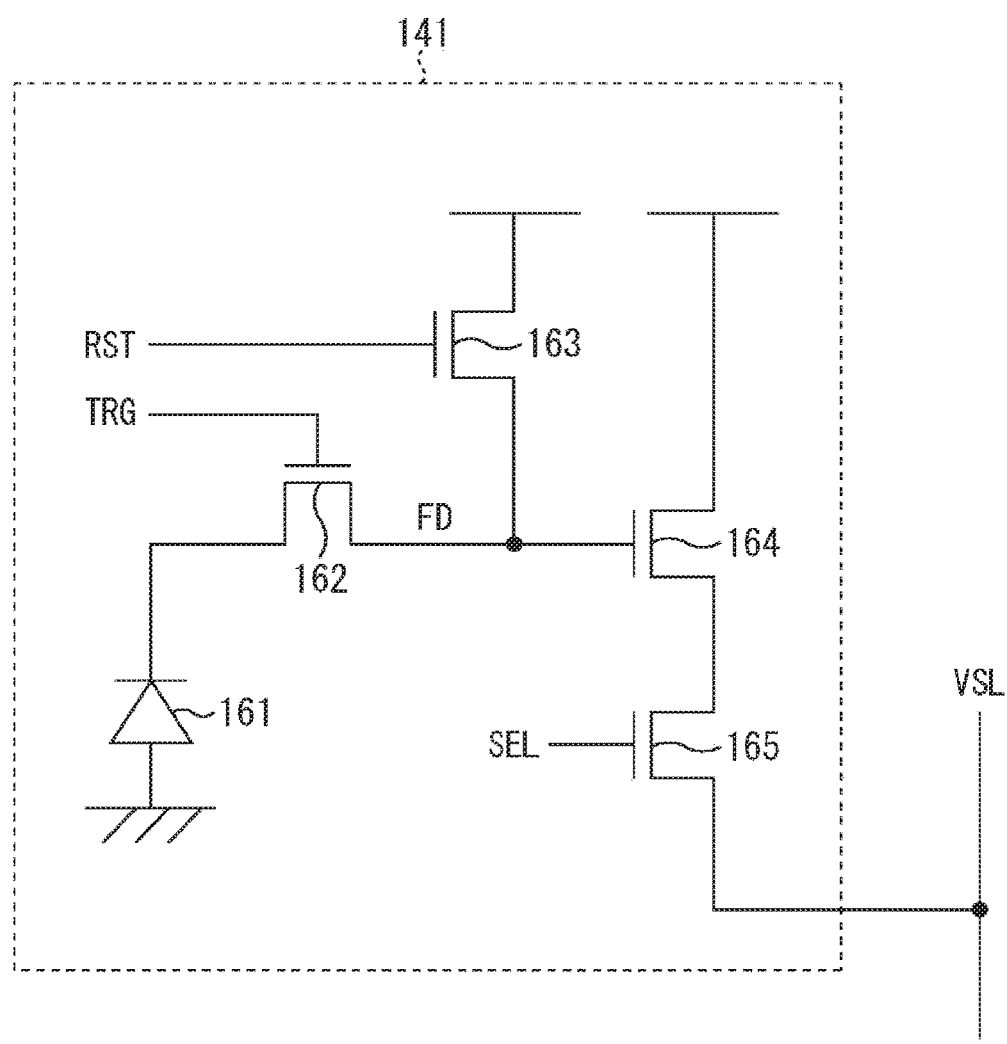
FIG. 8 is a diagram of a main configuration example of a unit pixel.

FIG. 8 is a diagram of a main circuit configuration example of each unit pixel 141. As illustrated in FIG. 8, the unit pixel 141 includes a photodiode (PD) 161, a transfer transistor 162, a reset transistor 163, an amplification transistor 164, and a select transistor 165.

The photodiode (PD) 161 is configured to photoelectrically convert received light into the amount of optical charge (in this example, photoelectron) corresponding to the amount of received light, thereby storing the optical charge. The stored optical charge is read at predetermined timing. An anode electrode of the photodiode (PD) 161 is connected to the ground (the pixel ground) of the pixel region, and a cathode electrode of the photodiode (PD) 161 is connected to a floating diffusion (FD) via the transfer transistor 162. Needless to say, a system may be employed, in which the cathode electrode of the photodiode (PD) 161 is connected to a power supply (a pixel power supply) of the pixel region, the anode electrode of the photodiode (PD) 161 is connected to the floating diffusion (FD) via the transfer transistor 162, and the optical charge is read as a photohole.

The transfer transistor 162 is configured to control reading of the optical charge from the photodiode (PD) 161. A drain electrode of the transfer transistor 162 is connected to the floating diffusion, and a source electrode of the transfer transistor 162 is connected to the cathode electrode of the photodiode (PD) 161. Moreover, a gate electrode of the transfer transistor 162 is connected to a transfer control line (TRG) via which a transfer control signal supplied from the pixel scanning unit 122 is transmitted. That is, this transfer control line (TRG) is included in the control lines illustrated in FIG. 7.

When the signal of the transfer control line (TRG) (i.e., the gate potential of the transfer transistor 162) is OFF, no optical charge is transferred from the photodiode (PD) 161 (the optical charge is stored in the photodiode (PD) 161). On the other hand, when the signal of the transfer control line (TRG) is ON, the optical charge stored in the photodiode (PD) 161 is transferred to the floating diffusion (FD).

The reset transistor 163 is configured to reset the potential of the floating diffusion (FD). A drain electrode of the reset transistor 163 is connected to a power supply potential, and a source electrode of the reset transistor 163 is connected to the floating diffusion (FD). Moreover, a gate electrode of the reset transistor 163 is connected to a reset control line (RST) via which a reset control signal supplied from the pixel scanning unit 122 is transmitted. That is, this reset control line (RST) is included in the control lines illustrated in FIG. 7.

When the signal of the reset control line (RST) (i.e., the gate potential of the reset transistor 163) is OFF, the floating diffusion (FD) is disconnected from the power supply potential. On the other hand, when the signal of the reset control line (RST) is ON, the charge of the floating diffusion (FD) is discharged to the power supply potential, and then, the floating diffusion (FD) is reset.

The amplification transistor 164 is configured to amplify a change in the potential of the floating diffusion (FD) to output the resultant as an electric signal (an analog signal). A gate electrode of the amplification transistor 164 is connected to the floating diffusion (FD), a drain electrode of the amplification transistor 164 is connected to a source follower power supply voltage, and a source electrode of the amplification transistor 164 is connected to a drain electrode of the select transistor 165.

For example, the amplification transistor 164 outputs, to the select transistor 165, the potential of the floating diffusion (FD) reset by the reset transistor 163 as a reset signal (a reset level).

Moreover, the amplification transistor 164 outputs, to the select transistor 165, the potential of the floating diffusion (FD) as an optical storage signal (an optical storage signal level), the optical charge being transferred to the floating diffusion (FD) by the transfer transistor 162.

The select transistor 165 is configured to control output of the electric signal supplied from the amplification transistor 164 to the vertical signal line (VSL) (i.e., the A/D conversion unit 112). A drain electrode of the select transistor 165 is connected to the source electrode of the amplification transistor 164, and a source electrode of the select transistor 165 is connected to the vertical signal line (VSL). Moreover, a gate electrode of the select transistor 165 is connected to a select control line (SEL) via which a select control signal supplied from the pixel scanning unit 122 is transmitted. That is, this select control line (SEL) is included in the control lines illustrated in FIG. 7.

When the signal of the select control line (SEL) (i.e., the gate potential of the select transistor 165) is OFF, the amplification transistor 164 and the vertical signal line (VSL) are electrically disconnected from each other. Thus, in such a state, the reset signal, the pixel signal, etc. are not output from the unit pixel 141. On the other hand, when the signal of the select control line (SEL) is ON, the unit pixel 141 is in a selected state. That is, the amplification transistor 164 and the vertical signal line (VSL) are electrically connected to each other, and the signal output from the amplification transistor 164 is, as the analog signal read from the unit pixel 141, supplied to the vertical signal line (VSL). That is, the reset signal, the pixel signal, etc. are read from the unit pixel 141.

<Configuration of Column A/D Conversion Unit>

Figure 9:
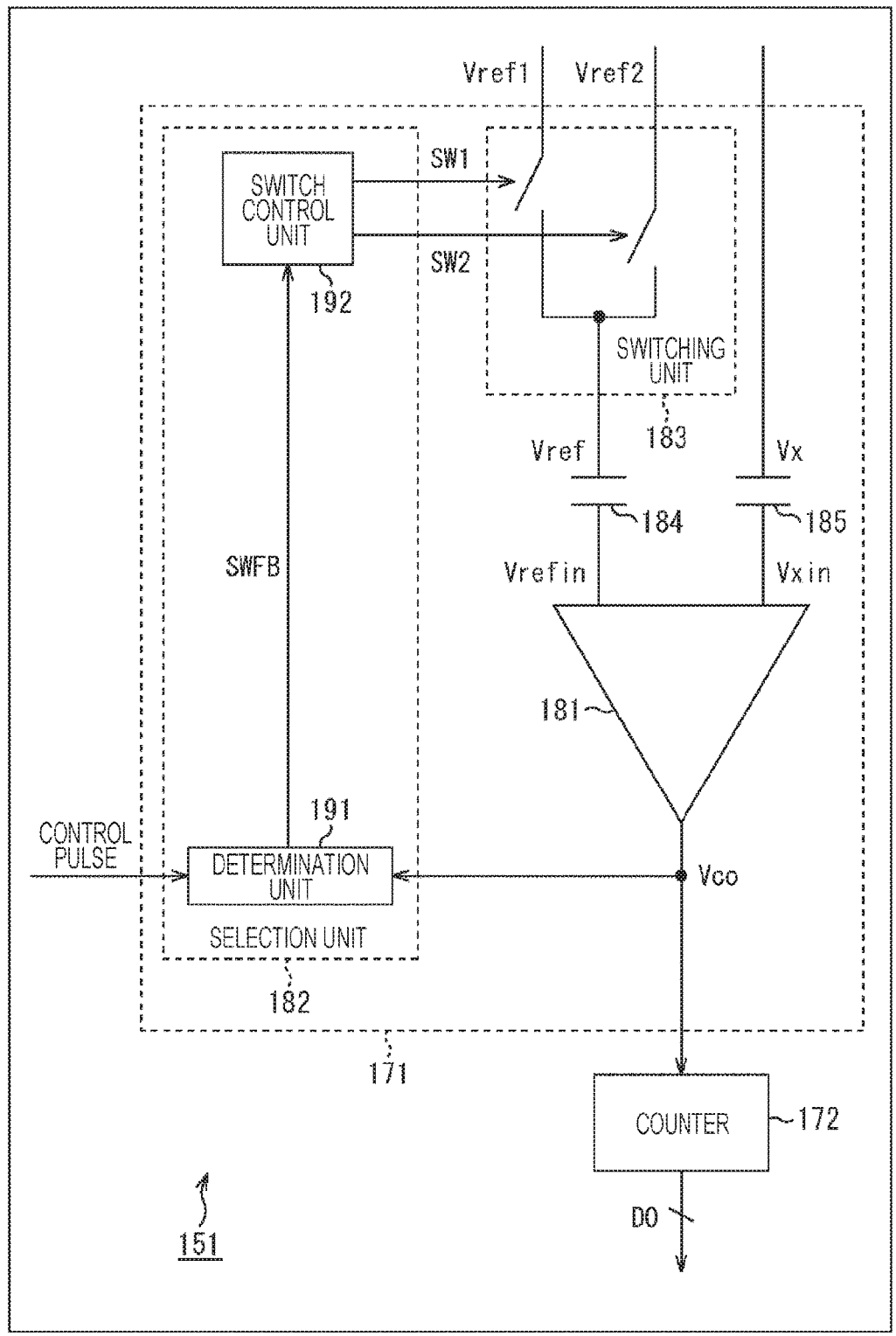
FIG. 9 is a diagram of a main configuration example of a column A/D conversion unit.

Next, a configuration example of each column A/D conversion unit 151 will be described with reference to FIG. 9. As illustrated in FIG. 9, the column A/D conversion unit 151 includes a comparison unit 171 and a counter 172.

The comparison unit 171 is one form of the signal processing device to which the present technology is applied. The comparison unit 171 is configured to select either one of the reference signal Vref1 and the reference signal Vref2 to compare the signal level of the signal Vx with the signal level of the selected reference signal. The comparison unit 171 performs such comparison multiple times. Then, the comparison unit 171 supplies the counter 172 with a signal Vco indicating the comparison result every time comparison is made.

The counter 172 is configured to count a time (a clock number) until the comparison result (a value of the signal Vco) changes after the start of comparison by the comparison unit 171. Such a counted value (digital data) is taken as the A/D conversion result of the signal Vx as the analog signal. The counter 172 supplies the horizontal transfer unit 113 with the counted value as the digital output DO.

As illustrated in FIG. 9, the comparison unit 171 includes a comparison unit 181, a selection unit 182, a switching unit 183, a capacitor 184, and a capacitor 185.

For reducing an offset error, the capacitor 184 is connected to an input terminal Vrefin of the comparison unit 181, and the capacitor 185 is connected to an input terminal Vxin of the comparison unit 181.

That is, the input terminal Vrefin and the input terminal Vxin of the comparison unit 181 form floating nodes. With this configuration, even when there is a threshold error in an input MOS, such an error is removed for initialization by short-circuit of input and output of the comparison unit 181, and a level in initialization can be stored in the series-capacitance floating nodes.

The comparison unit 181 is configured to compare the signal level of the signal Vx (the analog signal read from the pixel array 111) input to the input terminal Vxin with the signal level of the reference signal (the reference signal Vref1 or the reference signal Vref2) input to the input terminal Vrefin, thereby supplying the selection unit 182 and the counter 172 with the signal Vco indicating such a comparison result. The comparison unit 181 performs such comparison multiple times. The comparison unit 181 supplies the selection unit 182 and the counter 172 with the signal Vco indicating the comparison result every time comparison is made.

The selection unit 182 is configured to select the reference signal to be supplied to the comparison unit 181 on the basis of a control pulse supplied from the A/D conversion control unit 123 and a signal indicating the comparison result output from the comparison unit 181. The selection unit 182 supplies the switching unit 183 with control signals (a control signal SW1 and a control signal SW2) for causing the switching unit 183 to optionally switch connection such that the selected reference signal (the reference signal Vref1 or the reference signal Vref2) is supplied to the comparison unit 181.

The switching unit 183 is configured to select either one of the reference signal Vref1 and the reference signal Vref2 on the basis of control by the selection unit 182, i.e., the control signal SW1 and the control signal SW2 supplied from the selection unit 182, thereby supplying the capacitor 184 with the selected reference signal.

For example, the switching unit 183 includes a switch configured to control connection between the reference signal line via which the reference signal Vref1 is transmitted and the capacitor 184, and a switch configured to control connection between the reference signal line via which the reference signal Vref2 is transmitted and the capacitor 184. The switch configured to control connection between the reference signal line via which the reference signal Vref1 is transmitted and the capacitor 184 is controlled according to the control signal SW1 supplied from the selection unit 182. The switch configured to control connection between the reference signal line via which the reference signal Vref2 is transmitted and the capacitor 184 is controlled according to the control signal SW2 supplied from the selection unit 182.

According to values of these control signals, the switching unit 183 turns on (ON) the switch between a desired reference signal line and the capacitor 184, thereby connecting such a reference signal line to the capacitor 184. Moreover, the switching unit 183 turns off (OFF) another switch between another reference signal line and the capacitor 184, thereby disconnecting (bringing a non-connection state) such a reference signal line from the capacitor 184.

The capacitor 184 is provided between the switching unit 183 and the input terminal Vrefin of the comparison unit 181. The capacitor 185 is provided between the vertical signal line VSL (the pixel array 111) of the pixel array 111 and the input terminal Vxin of the comparison unit 181.

As illustrated in FIG. 9, the selection unit 182 includes a determination unit 191 and a switch control unit 192. The determination unit 191 is configured to determine the reference signal to be selected on the basis of the control pulse supplied from the A/D conversion control unit 123 and the signal indicating the comparison result output from the comparison unit 181. The determination unit 191 supplies, via a predetermined signal line, the switch control unit 192 with the signal indicating such a determination result, i.e., the signal SWFB indicating the reference signal to be selected by the selection unit 182.

The switch control unit 192 is configured to determine the values of the control signal SW1 and the control signal SW2 according to the signal SWFB supplied via the signal line. The switch control unit 192 supplies the switching unit 183 with the control signals SW1, SW2 whose values have been determined, thereby controlling operation of the switching unit 183.

With circuit miniaturization, the selection unit 182 is formed closer to the comparison unit 181, and therefore, the parasitic capacitance is caused between the signal line via which the signal SWFB from the selection unit 182 is transmitted and the input terminal Vrefin or the input terminal Vxin as the floating node of the comparison unit 181. Note that the comparison unit 181 may be configured such that only one of the input terminal Vrefin and the input terminal Vxin is the floating node.

When the comparison unit 181 performs signal level comparison multiple times, the signal level of the signal SWFB is the same among these comparison processes. With this configuration, the influence of coupling voltage fluctuation due to the parasitic capacitance on the comparison result obtained by the comparison unit 181 can be reduced.

<Selection Unit>

Figure 10:
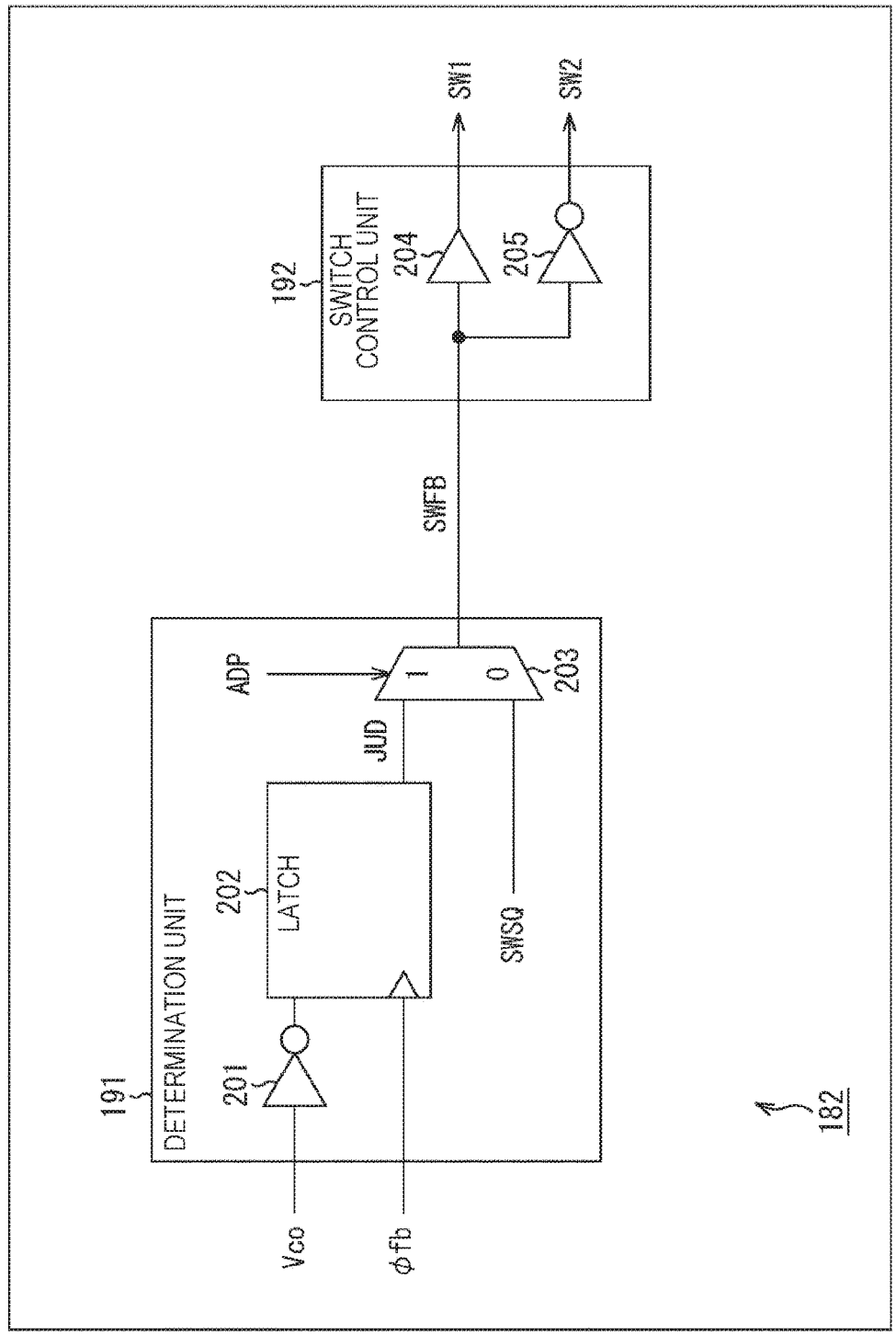
FIG. 10 is a diagram of a main configuration example of a selection unit.

A main configuration example of the selection unit 182 is illustrated in FIG. 10. As illustrated in FIG. 10, the determination unit 191 of the selection unit 182 includes a NOT gate 201, a latch 202, and a switch 203. The NOT gate 201 is configured to invert the output Vco of the comparison unit 181 as one-bit digital data. The latch 202 is configured to hold such output of the NOT gate 201 at timing corresponding to the control signal Φfb supplied from the A/D conversion control unit 123, thereby outputting such a held value (JUD).

The switch 203 is configured to select, according to the value of the control signal ADP supplied from the A/D conversion control unit 123, either one of the output JUD of the latch 202 and the signal SWSQ supplied from the A/D conversion control unit 123. For example, when the value of the control signal ADP is "1," the switch 203 selects the output JUD of the latch 202. Moreover, when the value of the control signal ADP is "0," the switch 203 selects the signal SWSQ, for example. The switch 203 supplies, as the signal SWFB, the switch control unit 192 with the selected signal.

The switch control unit 192 includes an amplifier 204 and a NOT gate 205. The amplifier 204 is configured to amplify the signal SWFB to supply, as the control signal SW1, the switching unit 183 with the amplified signal SWFB. The NOT gate 205 is configured to invert the signal SWFB as one-bit digital data, thereby supplying, as the control signal SW2, the switching unit 183 with the inverted signal SWFB.

<Flow of A/D Conversion Processing>

Next, an example of A/D conversion by the column A/D conversion unit 151 will be described.

Figure 11:
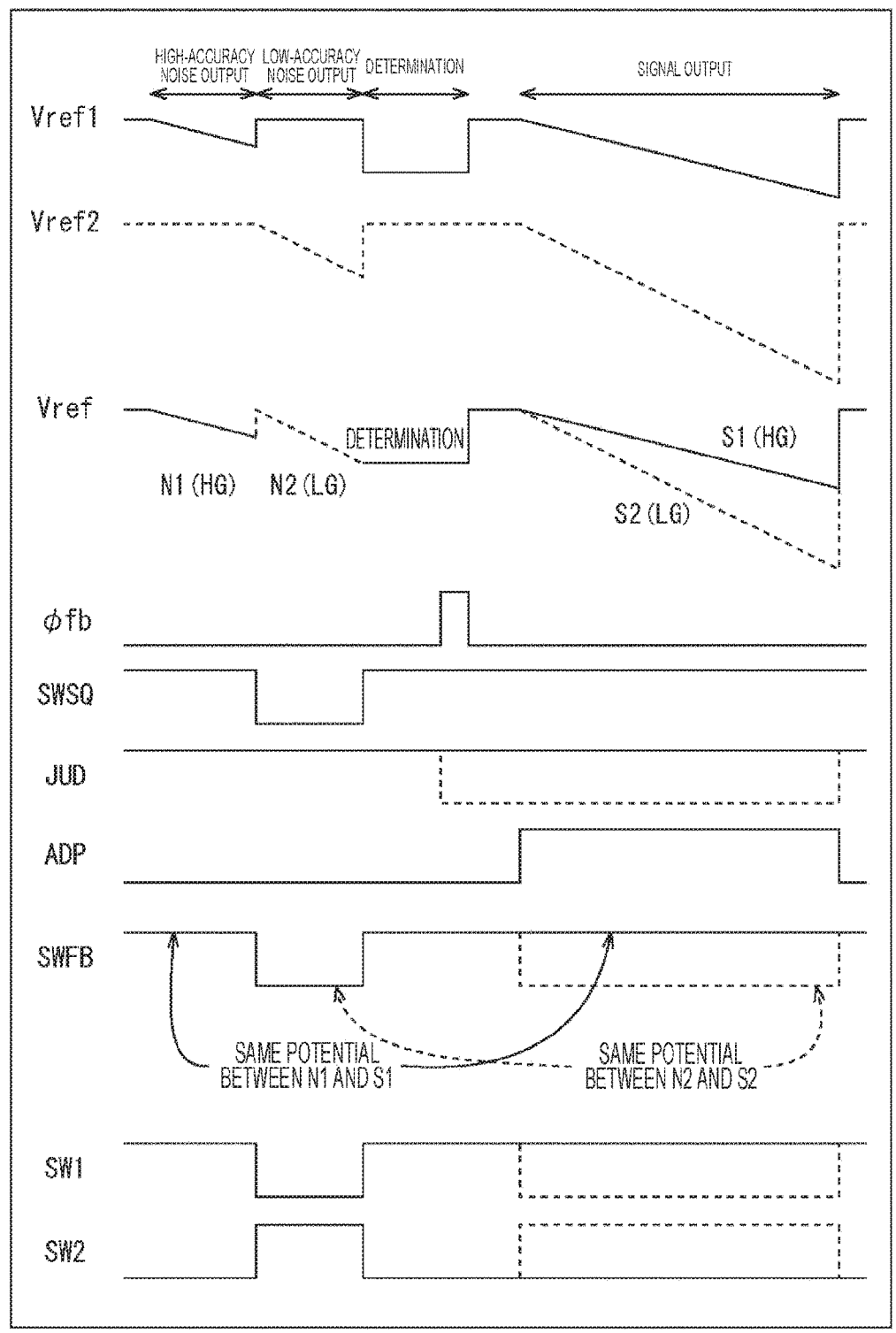
FIG. 11 is a timing chart for describing an example of a state in A/D conversion.

The column A/D conversion unit 151 performs A/D conversion as in a timing chart illustrated in FIG. 11. That is, in the CDS reset period, the column A/D conversion unit 151 first uses the reference signal Vref1 with the high-gain slope to perform A/D conversion of the reset signal read from the unit pixel 141, thereby obtaining a signal N1 (HG) (high-accuracy noise output). Next, in the CDS reset period, the column A/D conversion unit 151 uses the reference signal Vref2 with the low-gain slope to perform A/D conversion of the reset signal read from the unit pixel 141, thereby obtaining a signal N2 (LG) (low-accuracy noise output). Next, the column A/D conversion unit 151 determines the signal level of the pixel signal read from the unit pixel 141 (determination). According to such a determination result, the column A/D conversion unit 151 selects the reference signal Vref1 or the reference signal Vref2. Then, in the CDS signal reading period, the column A/D conversion unit 151 uses the selected reference signal to perform A/D conversion of the signal level of the pixel signal read from the unit pixel 141, thereby obtaining a signal S1 (HG) or a signal S2 (LG) (signal output).

As illustrated in FIG. 11, since the value of the control signal ADP is "0" in the CDS reset period, the values of the control signal SW1 and the control signal SW2 are determined according to the value of the control signal SWSQ. That is, in the CDS reset period, the value of the control signal SWSQ sequentially becomes "1" or "0," and therefore, the reference signal Vref1 and the reference signal Vref2 are sequentially selected. Thus, A/D conversion for the high-gain slope and A/D conversion for the low-gain slope are sequentially performed.

Thus, in the CDS reset period, the signal SWFB sequentially becomes a value of "1" or "0" as in the control signal SW1.

Moreover, using the pulse of the control signal Φfb, the output Vco of the comparison unit 181 is latched in a determination period. Then, in the CDS signal reading period, the value of the control signal ADP is "1," and the values of the control signal SW1 and the control signal SW2 are determined according to the value of the output JUD of the latch 202. That is, in the CDS signal reading period, the reference signal Vref1 or the reference signal Vref2 is selected according to the output JUD of the latch 202, i.e., the determination result of the signal level of the pixel signal in the determination period. Using the selected reference signal, A/D conversion (A/D conversion for the high-gain slope or A/D conversion for the low-gain slope) is performed.

Thus, in the CDS signal reading period, the signal SWFB is a value of "1" or "0" (the value according to the determination result of the signal level of the pixel signal in the determination period) as in the control signal SW1. That is, in the case of selecting the low illuminance (A/D conversion for the high-gain slope), the value of the signal SWFB is "1." In the case of selecting the high illuminance (A/D conversion for the low-gain slope), the value of the signal SWFB is "0."

That is, as illustrated in FIG. 11, the potential (the signal SWFB) of the signal line of the selection unit 182 is the same between the case of obtaining the signal N1 and the case of obtaining the signal S1 and between the case of obtaining the signal N2 and the case of obtaining the signal S2, the parasitic capacitance being caused between the signal line and the input terminal Vrefin or the input terminal Vxin as the floating node of the comparison unit 181.

Thus, a difference in the coupling voltage fluctuation amount between the signal S1 and the signal N1 (or between the signal S2 and the signal N2) can be reduced, and both signals are subtracted so that the error due to coupling voltage fluctuation can be reduced. That is, the error in the correlated double sampling result (S1−N1 or S2−N2) can be reduced without an increase in the circuit area of the A/D conversion unit, leading to more accurate A/D conversion. Thus, an increase in the development and manufacturing costs can be suppressed. Moreover, an increase in the power consumption can be also suppressed.

Figure 12:
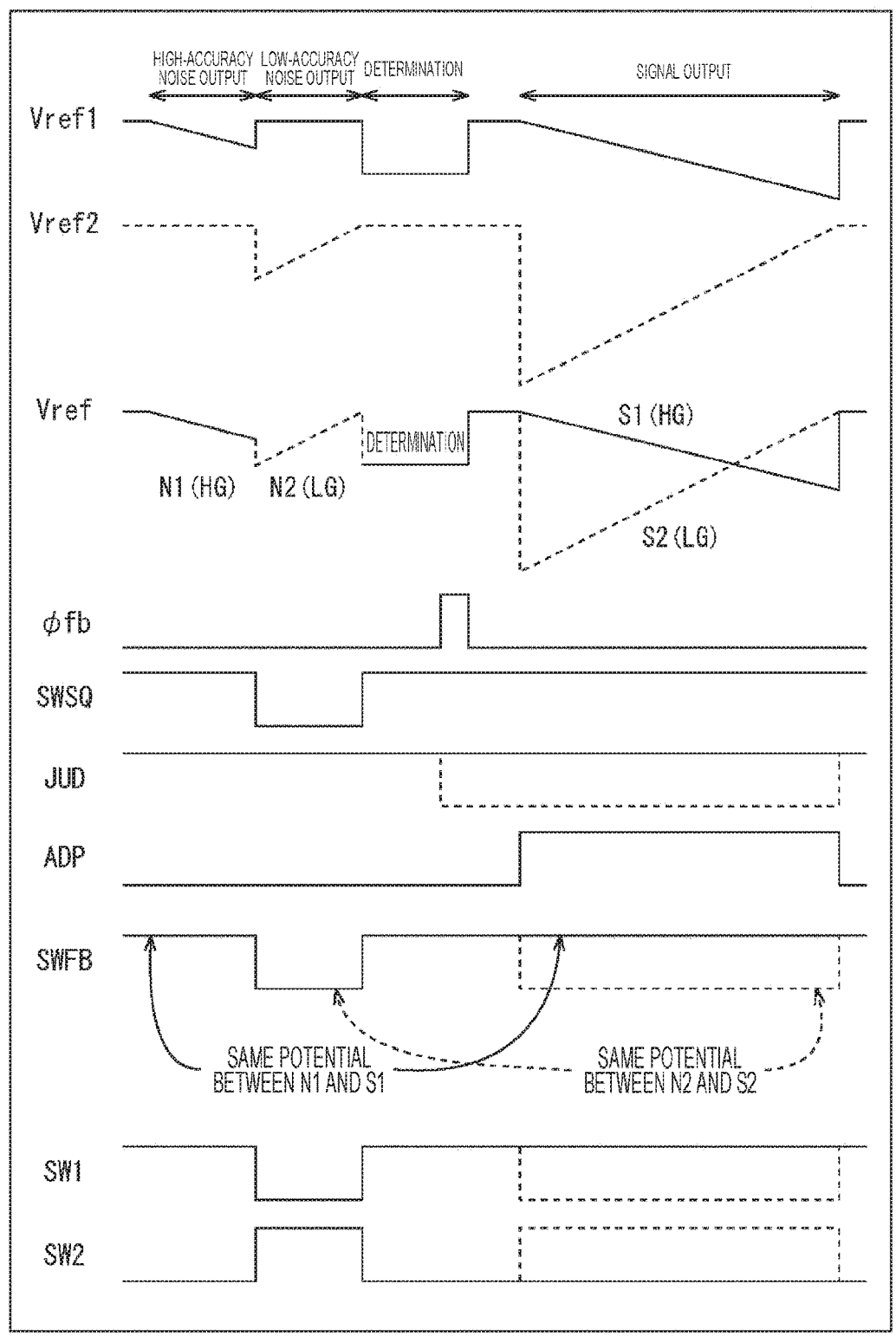
FIG. 12 is a timing chart for describing another example of the state in A/D conversion.

Note that the column A/D conversion unit 151 is, as in an example of FIG. 11, configured such that both of the reference signal Vref1 with the high-gain slope and the reference signal Vref2 with the low-gain slope fluctuate (sweep) in a voltage decrease direction, but may be configured such that one or both of the reference signals fluctuate in a voltage increase direction. For example, as in a timing chart illustrated in FIG. 12, the reference signal Vref2 with the low-gain slope may fluctuate in the voltage increase direction. This case is similar to the case of FIG. 11, except for a reference signal sweep direction. That is, in this case, the error in the correlated double sampling result (S1−N1 or S2−N2) can be also reduced without an increase in the circuit area of the A/D conversion unit, leading to more accurate A/D conversion. Thus, an increase in the development and manufacturing costs can be suppressed. Moreover, an increase in the power consumption can be also suppressed.

<2. Second Embodiment>

<Comparison Unit Initialization and Determination>

In the first embodiment, reduction in the error due to the change in the coupling voltage fluctuation amount in comparison of the reset signal and comparison of the pixel signal has been described. Similarly, upon completion of initialization of the comparison unit 11 and completion of determination of the signal level of the pixel signal, when the fluctuation amount of the coupling voltage on the floating node of the comparison unit 11 changes, this might lead to a determination error.

<Control of Signal SWFB>

Figure 13:
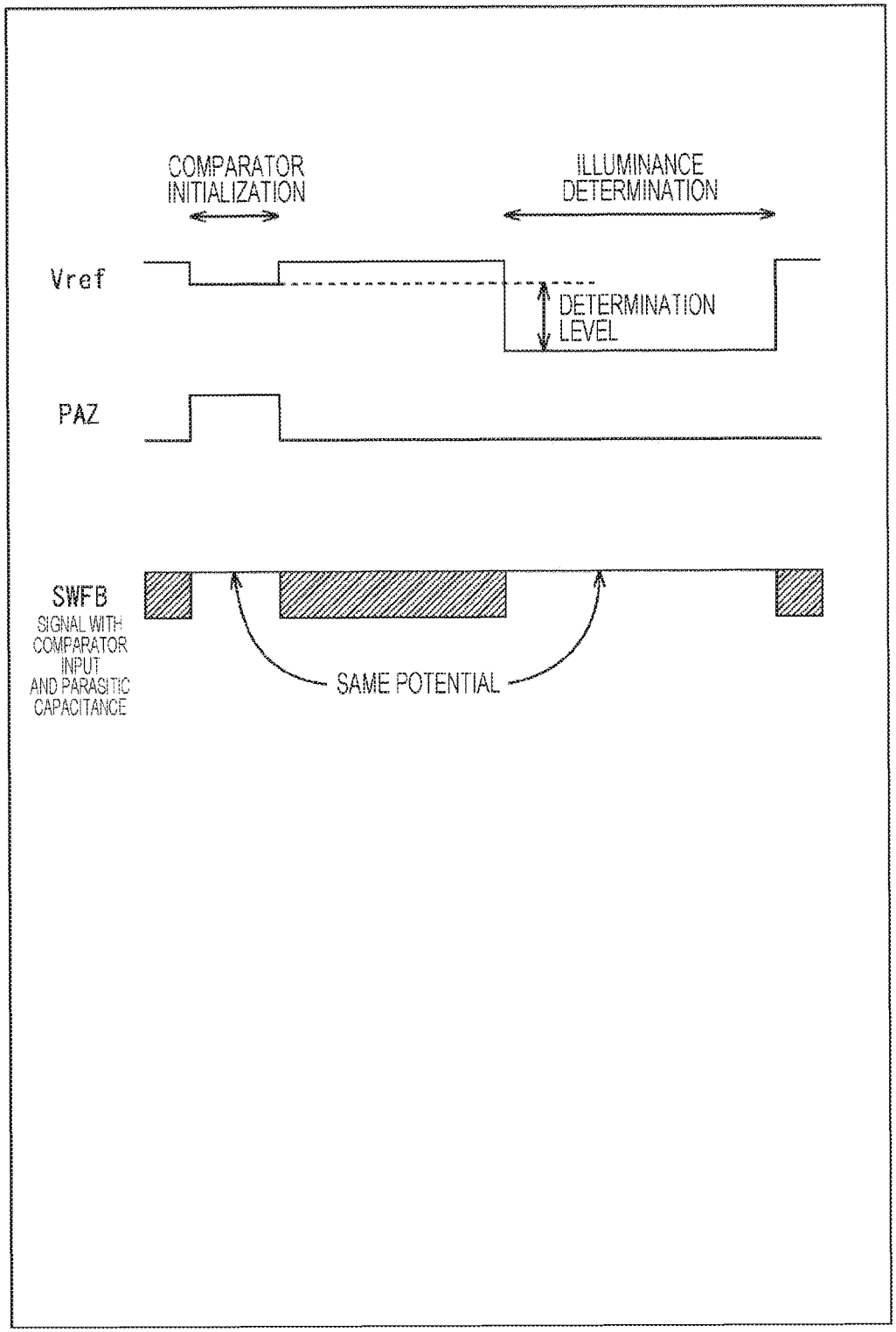
FIG. 13 is a timing chart for describing still another example of the internal signal of the switch control unit.

For the above-described reasons, a signal line which is included in a selection unit configured to select, from a plurality of reference signals, a reference signal to be supplied to an input terminal as a floating node of a comparison unit and in which a parasitic capacitance is caused between the signal line and the input node as the floating node of the comparison unit is configured to transmit the same level of signal in both of initialization of the comparison unit and comparison between the signal level of a pixel signal and the signal level of a predetermined reference signal by the comparison unit. For example, in the case of performing A/D conversion as in the example of FIG. 5, a value of a signal SWFB is the same between a period for initialization (comparator initialization) and a period for determining the signal level of the pixel signal (illuminance determination) as illustrated in FIG. 13.

As described above, in both of initialization of the comparison unit and comparison between the signal level of the pixel signal and the signal level of the predetermined reference signal by the comparison unit, the same potential of the signal SWFB transmitted via the signal line is applied, the parasitic capacitance being caused between the signal line and the input terminal as the floating node of the comparison unit. Thus, a coupling voltage fluctuation amount becomes constant, and the influence of the parasitic capacitance can be canceled out and reduced. Thus, an error in an illuminance determination result obtained by subtracting an initialization result of the comparison unit from a determination result of the signal level of the pixel signal can be reduced. That is, the error can be reduced without an increase in a circuit area of an A/D conversion unit, leading to more accurate A/D conversion. Thus, an increase in development and manufacturing costs can be suppressed. Further, an increase in power consumption can be also suppressed.

<Flow of A/D Conversion Processing>

Figure 14:
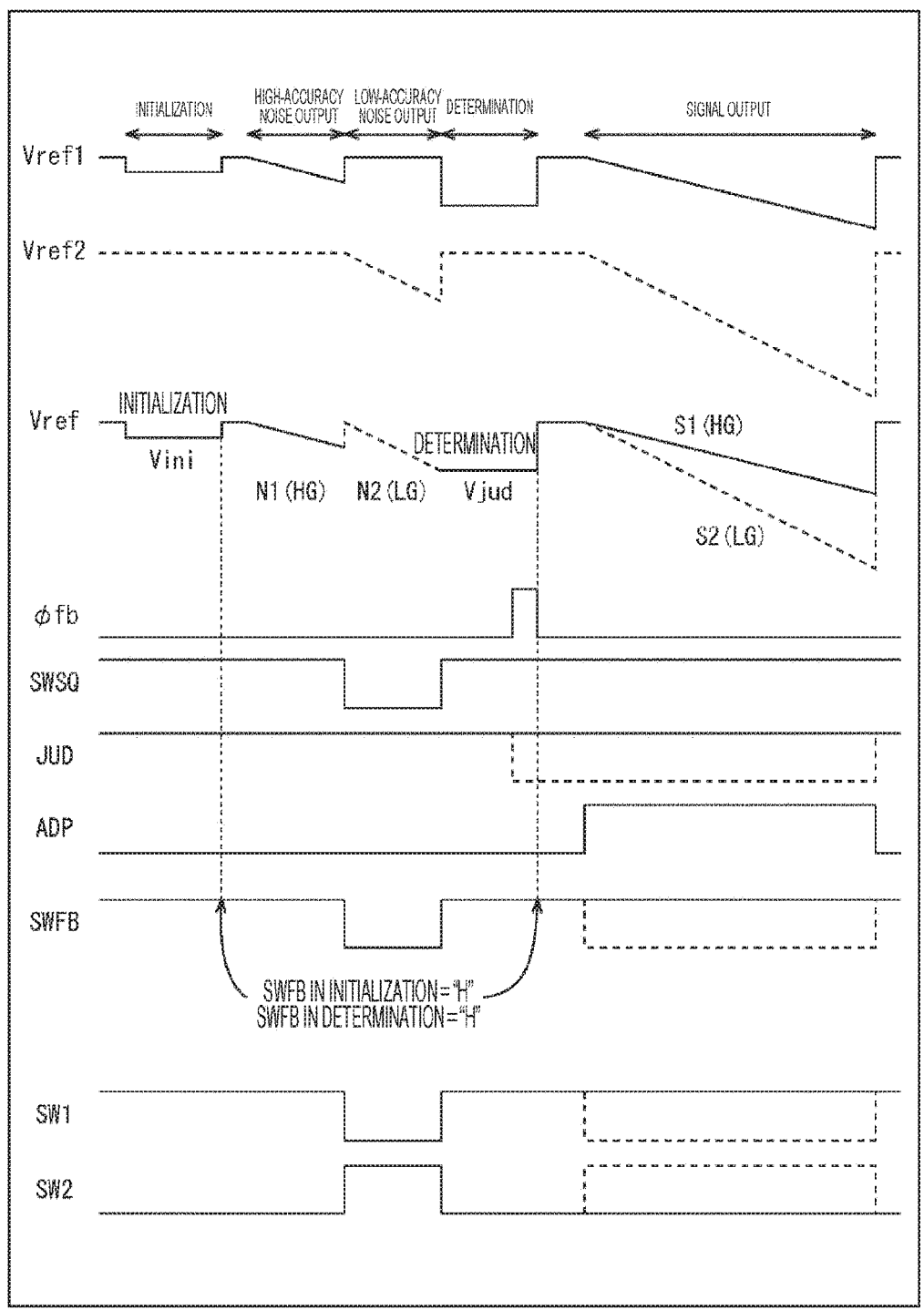
FIG. 14 is a timing chart for describing still another example of the state in A/D conversion.

In the above-described case, each column A/D conversion unit 151 may perform A/D conversion as in a timing chart illustrated in FIG. 14.

As illustrated in FIG. 14, the column A/D conversion unit 151 performs A/D conversion as in the example of FIG. 11 after initialization of a comparison unit 181. As illustrated in FIG. 14, in a period (initialization) for initialization of the comparison unit 181 and a period (determination) for determining the signal level of the pixel signal, a value of a control signal ADP is "0." Thus, in these periods, values of a control signal SW1 and a control signal SW2 are determined according to a value of a control signal SWSQ. That is, in these periods, the value of the signal SWFB is determined according to the value of the control signal SWSQ.

As illustrated in FIG. 14, in both of the period (initialization) for initialization of the comparison unit 181 and the period (determination) for determining the signal level of the pixel signal, the same value of the control signal SWSQ is applied ("1" is applied). Thus, in these periods, the same value of the signal SWFB is also applied ("1" is applied).

That is, the potential (the signal SWFB) of a signal line of a selection unit 182 is the same between the time of completion of initialization of the comparison unit and the time of completion of determination of the signal level of the pixel signal, a parasitic capacitance being caused between the signal line and an input terminal Vrefin or an input terminal Vxin as a floating node of the comparison unit 181.

Thus, a difference in the coupling voltage fluctuation amount between the initialization result (Vini) of the comparison unit and the determination result (Vjud) of the signal level of the pixel signal can be reduced, and both results are subtracted so that an error due to coupling voltage fluctuation can be reduced. That is, the error in the illuminance determination result (Vjud−Vini) can be reduced without an increase in the circuit area of the A/D conversion unit, leading to more accurate A/D conversion. Thus, an increase in the development and manufacturing costs can be suppressed. Moreover, an increase in the power consumption can be also suppressed.

Note that in an example of FIG. 14, not only the difference in the coupling voltage fluctuation amount between the initialization result of the comparison unit and the determination result of the signal level of the pixel signal is reduced, but also a difference in the coupling voltage fluctuation amount between a signal S1 and a signal N1 (or between a signal S2 and a signal N2) is reduced. However, only the difference in the coupling voltage fluctuation amount between the initialization result of the comparison unit and the determination result of the signal level of the pixel signal maybe reduced. Moreover, as in the example of FIG. 14, the column A/D conversion unit 151 may be configured such that both of a reference signal Vref1 with a high-gain slope and a reference signal Vref2 with a low-gain slope fluctuate (sweep) in a voltage decrease direction, but may be configured such that one or both of the reference signals fluctuate in a voltage increase direction. Further, in the case of the present embodiment, only one of the input terminal Vrefin and the input terminal Vxin of the comparison unit 181 may be the floating node as in the case of the first embodiment.

<3. Third Embodiment>

<Connection between Comparison Unit and Counter>

In each of the above-described embodiments, the signal line between the comparison unit 171 (the comparison unit 181) and the counter 172 is illustrated as connection via a single line for the sake of description. In fact, a plurality of signal lines connect between the comparison unit 171 (the comparison unit 181) and the counter 172 as in an example of FIG. 15, for example.

Figure 15:
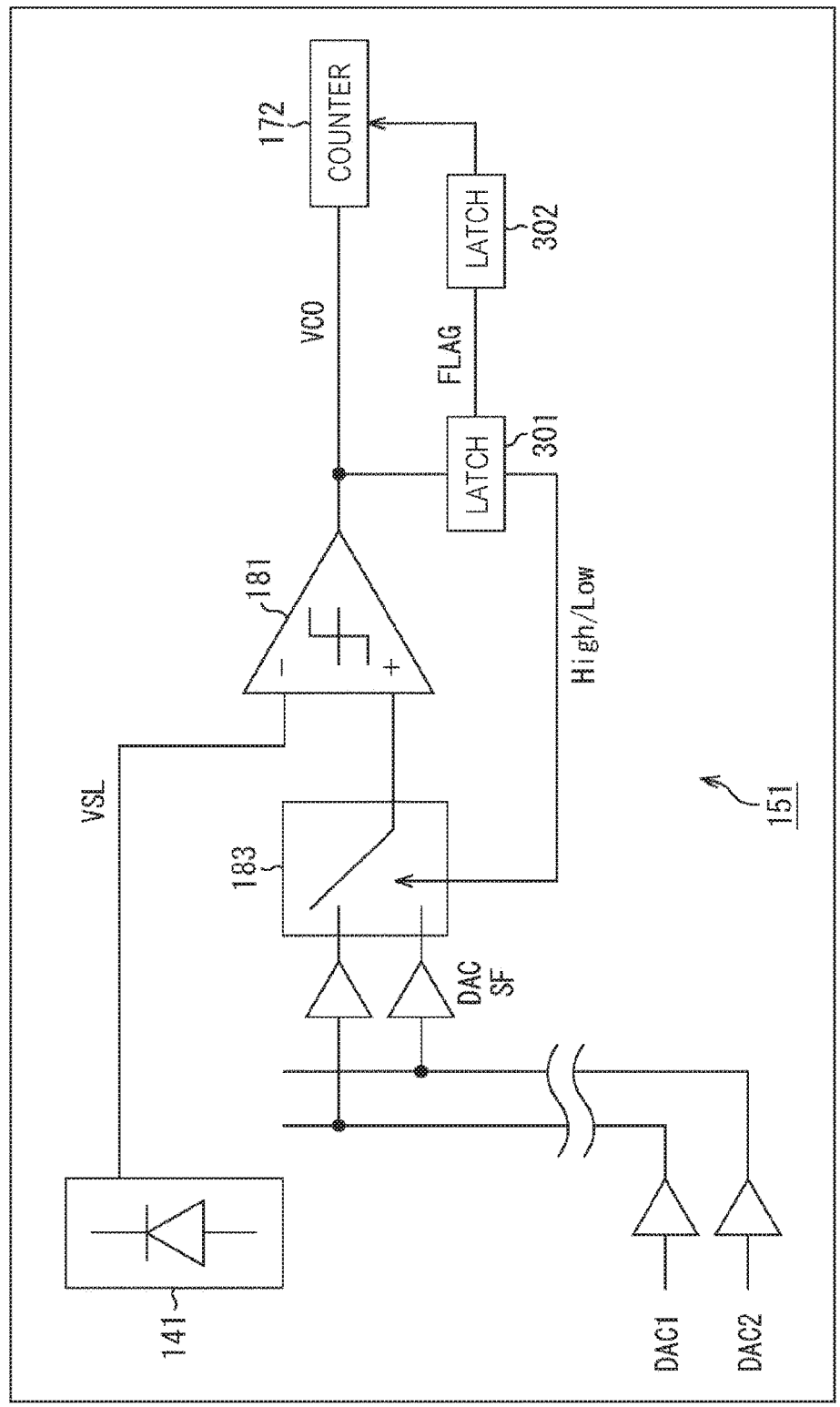
FIG. 15 is a diagram of another main configuration example of the column A/D conversion unit.

In the example of FIG. 15, each column A/D conversion unit 151 includes a latch 301 and a latch 302. The latch 301 is illustrated as a simple form of a selection unit 182 (FIG. 9). The output Vco of the comparison unit 181 in a period for determining the signal level of a pixel signal is latched by the latch 301, and control signals (a control signal SW1 and a control signal SW2) corresponding to such a value are supplied to a switching unit 183.

Moreover, on the basis of the latched output Vco of the comparison unit 181, the latch 301 supplies the latch 302 with an identification signal FLAG for identifying a slope gain for controlling a value of the counter 172. The latch 302 latches the identification signal FLAG. According to a value of the identification signal FLAG, the latch 302 supplies, at predetermined timing, the counter 172 with a control signal for adjusting the speed (e.g., the magnification) of counting of the counter 172 to that of a slope signal of a reference signal.

In this case, there are two signal lines between the comparison unit 181 and the counter 172 as illustrated in FIG. 15. Thus, there is a probability that a circuit area increases by such signal lines and that development and manufacturing costs and power consumption increase. Particularly in the case where the comparison unit 181 and the counter 172 are formed on different semiconductor substrates, the signal lines between the comparison unit 181 and the counter 172 need to be provided with connection units such as bumps. However, in the case of the example of FIG. 15, the number of bumps increases, and for this reason, there is a probability that the circuit area increases and that the development and manufacturing costs and the power consumption increase.

Figure 16:
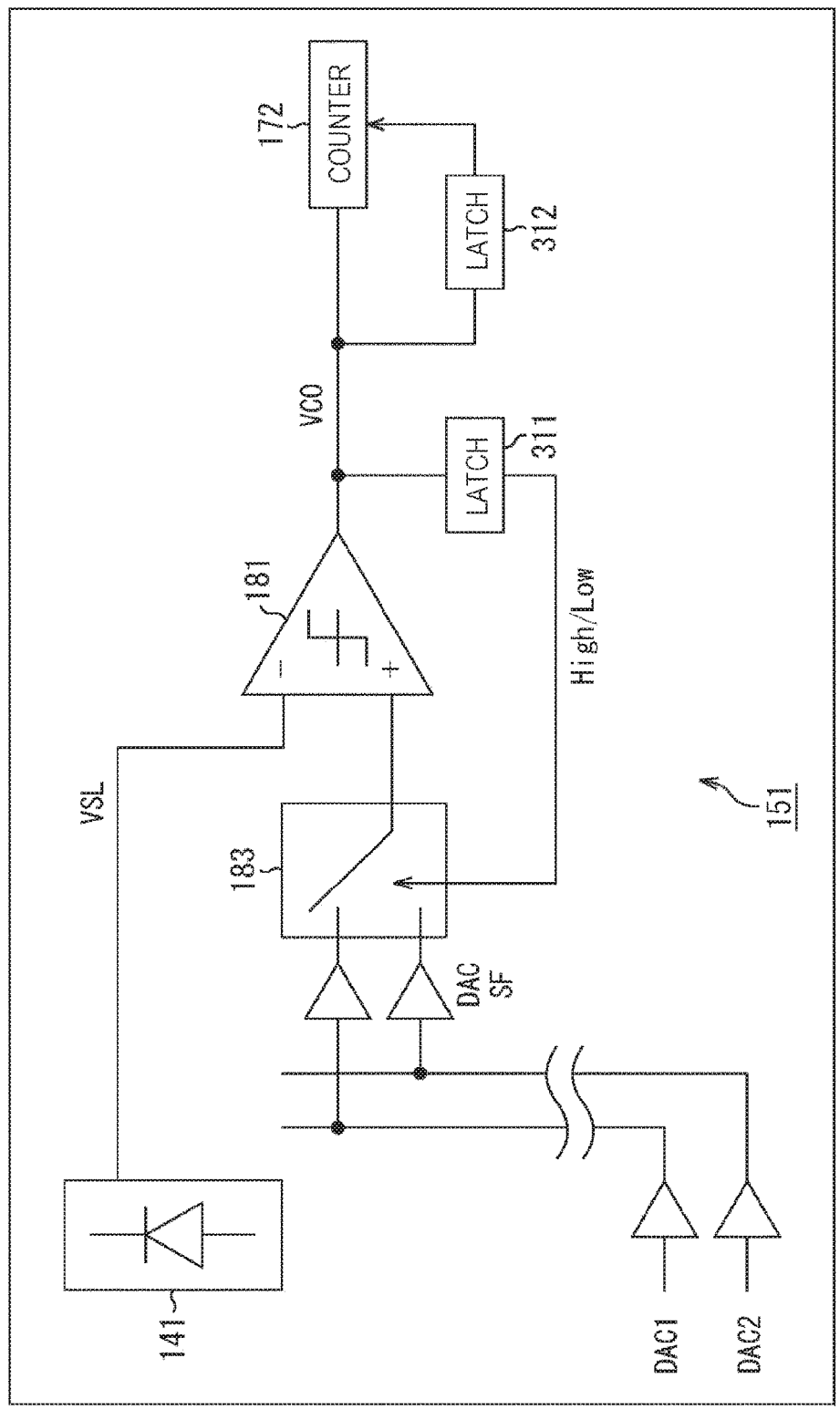
FIG. 16 is a diagram of still another main configuration example of the column A/D conversion unit.

For the above-described reasons, the column A/D conversion unit 151 may be configured as illustrated in FIG. 16. In the case of an example of FIG. 16, the column A/D conversion unit 151 includes, instead of the latch 301 and the latch 302 in FIG. 15, a latch 311 and a latch 312.

As in the latch 301, the latch 311 latches the output Vco of the comparison unit 181 in the period for determining the signal level of the pixel signal, and supplies the switching unit 183 with the control signals (the control signal SW1 and the control signal SW2) corresponding to such a value. However, the latch 311 supplies no signal to the latch 312.

The latch 312 obtains and latches, without latching the identification signal FLAG, the output Vco of the comparison unit 181 from the vicinity of the counter 172 in the signal line between the comparison unit 181 and the counter 172. According to a value of the output Vco, the latch 312 supplies the counter 172 with a control signal for adjusting the speed (e.g., the magnification) of counting of the counter 172 to that of the slope signal of the reference signal.

With such a configuration, a majority of the signal lines between the comparison unit 181 and the counter 172 can be formed as a single line, and an increase in the circuit area can be more suppressed as compared to the case of the configuration example of FIG. 15. Moreover, the single-line portion of these signal lines is provided with the connection unit (e.g., the bump), and therefore, an increase in the number of connection units can be more suppressed as compared to the case of the configuration example of FIG. 15. Thus, even when the comparison unit 181 and the counter 172 are formed on the different semiconductor substrates, an increase in the circuit area can be more suppressed as compared to the case of the configuration example of FIG. 15.

However, in the case of the configuration example of FIG. 16, a circuit configured to obtain a determination result (the output Vco of the comparison unit 181) of the signal level of the pixel signal is not a single-circuit system (the latch 311 and the latch 312 obtains the determination result from different points), and for this reason, there is a probability that the latch 311 and the latch 312 are different from each other in the timing of obtaining the determination result (one obtaining timing is deviated from the other). Then, due to such obtaining timing deviation, data latched by the latch 311 and data latched by the latch 312 might be different from each other, leading to failure in calculation.

<Mixture of Comparison Result and Control Signal>

For the above-described reasons, a mixing unit is configured to mix the signal indicating the comparison result obtained by the comparison unit with a signal indicating the reference signal selected by the selection unit. Moreover, a measurement unit is configured to measure a time until a value of the signal indicating the comparison result obtained by the comparison unit changes and output such a measurement result as an A/D conversion result of an analog signal, the signal being contained in a signal output from the mixing unit and transmitted via a single signal line. Further, a control unit is configured to control measurement of the measurement unit on the basis of the signal indicating the reference signal selected by the selection unit, the signal being contained in the signal output from the mixing unit and transmitted via the single signal line.

That is, the following units are provided: the mixing unit configured to mix the signal indicating the comparison result obtained by the comparison unit with the signal indicating the reference signal selected by the selection unit; the measurement unit configured to measure the time until the value of the signal indicating the comparison result obtained by the comparison unit changes and output the measurement result as the A/D conversion result of the analog signal, the signal being contained in the signal output from the mixing unit and transmitted via the single signal line; and the control unit configured to control measurement of the measurement unit on the basis of the signal indicating the reference signal selected by the selection unit, the signal being contained in the signal output from the mixing unit and transmitted via the single signal line.

With this configuration, the signal indicating the comparison result obtained by the comparison unit and the signal indicating the reference signal selected by the selection unit can be transmitted from the comparison unit to the measurement unit via the single signal line. Thus, an increase in the circuit area can be suppressed. Moreover, an increase in the number of connection units can be suppressed. As a result, even when the comparison unit and the measurement unit are formed on different semiconductor substrates, an increase in the circuit area can be suppressed.

<Column A/D Conversion Unit>

In this case, the configuration of the image sensor 100 is basically similar to that of the case of each embodiment described above. Only points which need to be described regarding the configuration and operation of the image sensor 100 will be described below. For points whose description will not be made, the same description in each embodiment described above is applicable, or optional configurations and operation are applicable.

Figure 17:
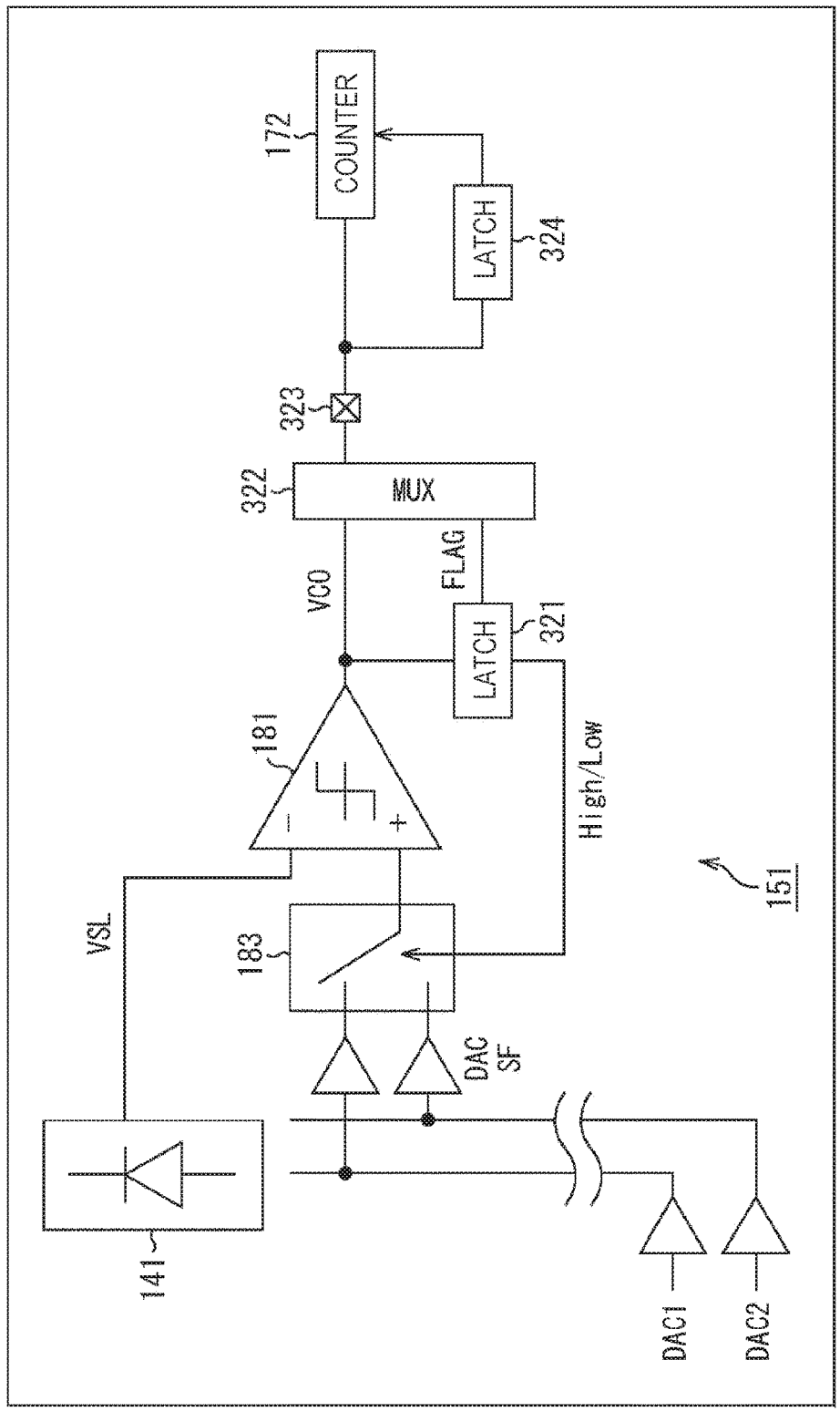
FIG. 17 is a diagram of still another main configuration example of the column A/D conversion unit.

A main configuration example of the column A/D conversion unit 151 in this case will be illustrated in FIG. 17. In the case of the example of FIG. 17, the column A/D conversion unit 151 includes, instead of the latch 301 and the latch 302 in FIG. 15, a latch 321, a multiplexer 322, an electrode 323, and a latch 324.

As in the latch 301, the latch 321 is illustrated as a simple form of the selection unit 182 (FIG. 9). The output Vco of the comparison unit 181 in the period for determining the signal level of the pixel signal is latched by the latch 321, and the control signals (the control signal SW1 and the control signal SW2) corresponding to such a value are supplied to the switching unit 183.

Moreover, on the basis of the latched output Vco of the comparison unit 181, the latch 321 supplies the multiplexer 322 with the identification signal FLAG for identifying the slope gain for controlling the value of the counter 172.

The multiplexer (MUX) 322 is configured to mix the identification signal FLAG with the output Vco of the comparison unit 181 in the period for determining the signal level of the pixel signal, thereby supplying the counter 172 with the resultant mixed signal. The multiplexer 322 mixes the output Vco of the comparison unit 181 and the control signal FLAG such that these signals are transmitted in different periods via a single signal line. Such mixture will be described later in detail.

The electrode 323 is a connection unit such as a bump (BUMP) or a via (VIA). The counter 172 and the latch 324 are formed on a semiconductor substrate different from that for the multiplexer 322 and the configuration illustrated on the left side of the multiplexer 322 in FIG. 17. The electrode 323 is the connection unit configured to connect circuits between a plurality of semiconductors as described above. Note that the counter 172 and the latch 324 may be formed on the same semiconductor substrate as that for the multiplexer 322 and the configuration illustrated on the left side of the multiplexer 322 in FIG. 17. In this case, the electrode 323 can be omitted.

As in the latch 312, the latch 324 obtains the mixed signal from the vicinity of the counter 172 (at least from the side closer to the counter 172 with respect to the electrode 323) in the signal line between the comparison unit 181 and the counter 172, thereby latching the control signal FLAG contained in the mixed signal. According to the value of the output Vco, the latch 312 supplies the counter 172 with the control signal for adjusting the speed (e.g., the magnification) of counting of the counter 172 to that of the slope signal of the reference signal.

The counter 172 is configured to perform counting according to such a control signal.

<Comparison Unit>

Figure 18:
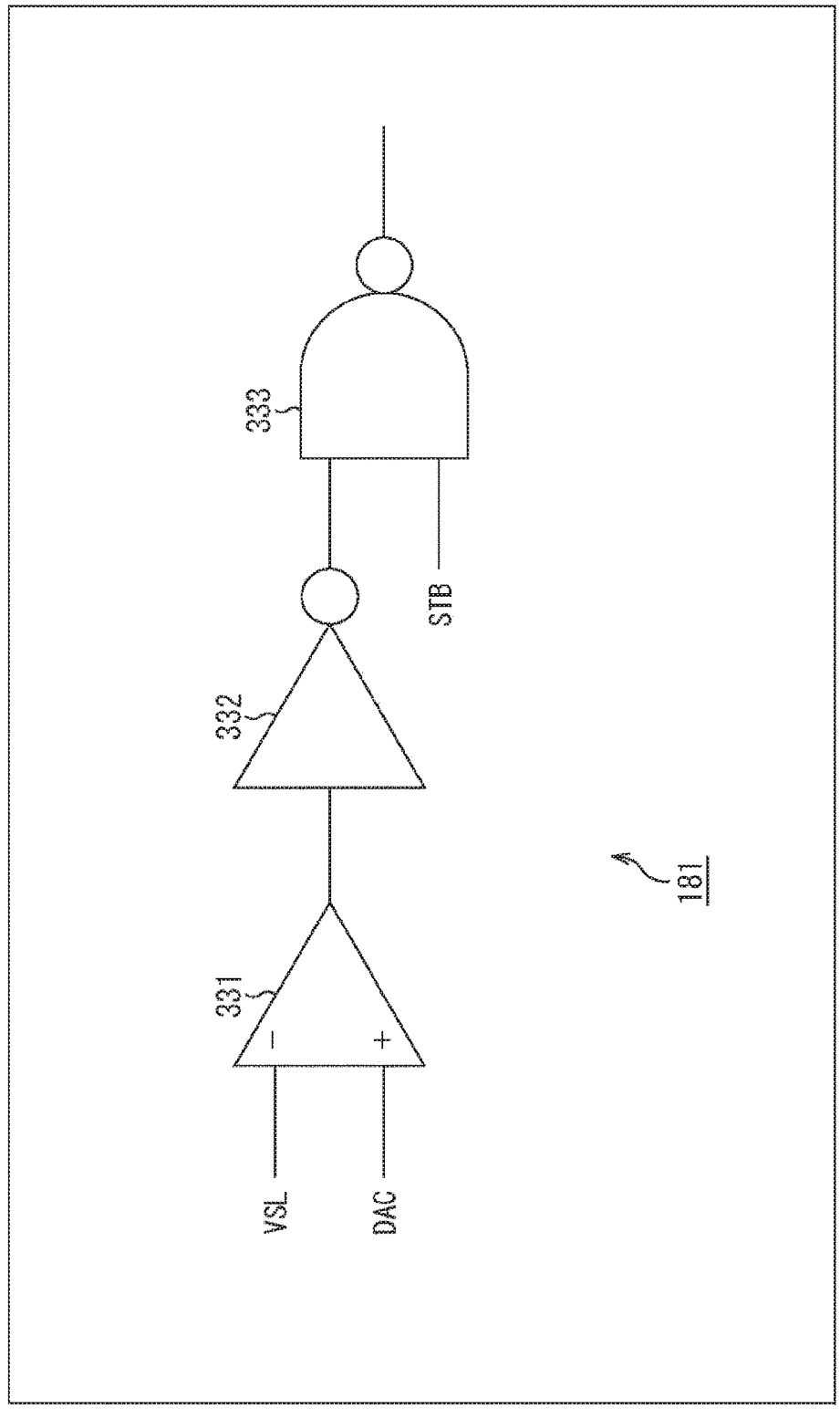
FIG. 18 is a diagram of another main configuration example of the comparison unit.

A main configuration example of the comparison unit 181 in this case will be illustrated in FIG. 18. As illustrated in FIG. 18, the comparison unit 181 is configured using a comparison unit 331, a NOT gate 332, and a NAND gate 333, for example.

The NOT gate 332 obtains a logical NOT of the result of comparison between an analog signal VSL read from the unit pixel 141 and a reference signal DAC by the comparison unit 331, and then, the NAND gate 333 outputs such a logical NOT to the latch 321 and the multiplexer 322 at timing controlled according to a control signal STB. That is, the output timing of the output Vco of the comparison unit 181 can be controlled using the control signal STB.

<Flow of Mixture>

Figure 19:
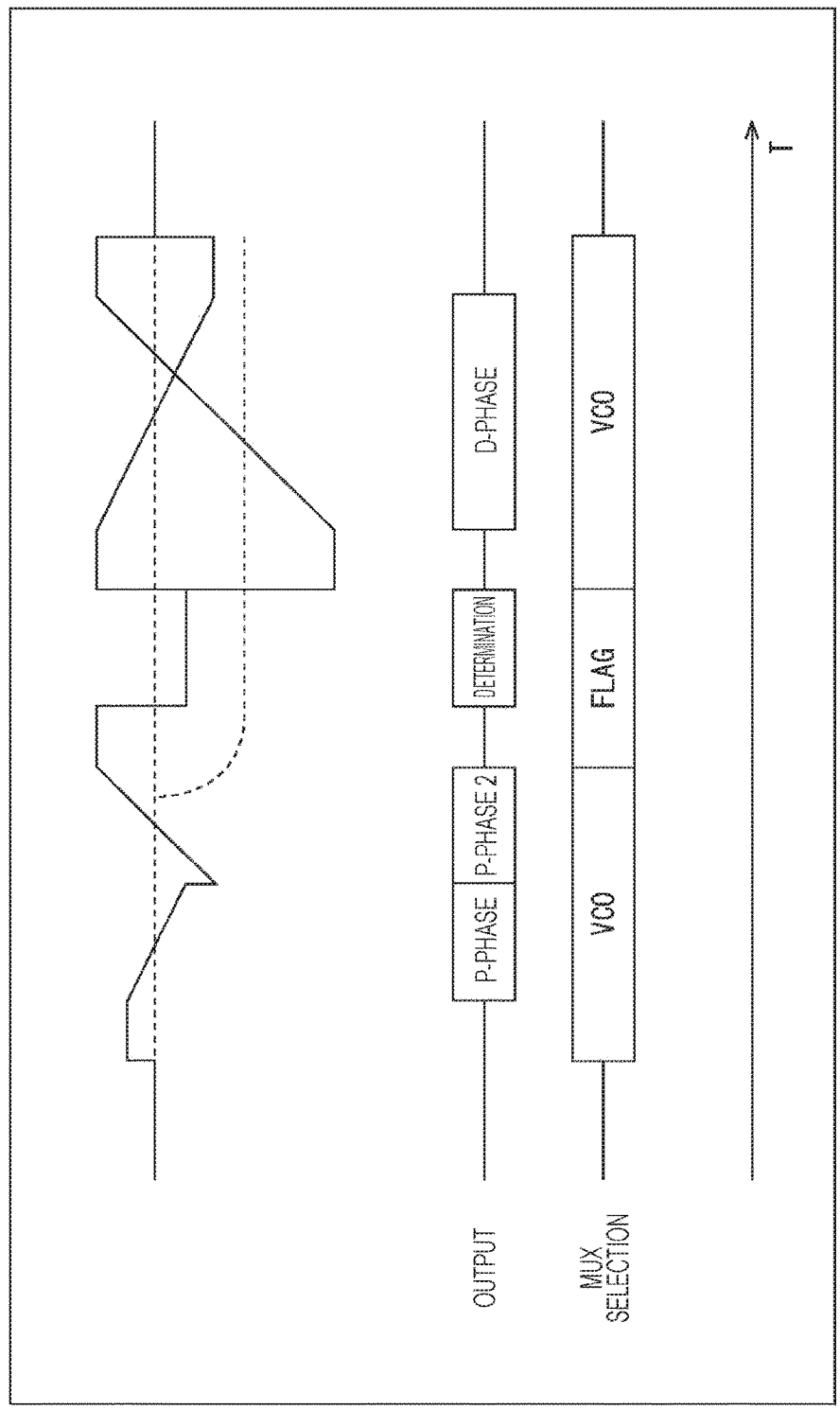
FIG. 19 is a timing chart for describing an example of a state in mixture.

In this case, the image sensor 100 (the column A/D conversion unit 151) also performs A/D conversion as in the case of each embodiment described above. Furthermore, as illustrated in FIG. 19, the multiplexer 322 outputs the output Vco of the comparison unit 181 in a CDS reset period (a P-phase and a P-phase 2) and a CDS signal reading period (a D-phase), and outputs the control signal FLAG in the period for determining the signal level of the pixel signal.

The counter 172 does not perform counting in a determination period, and the latch 324 latches the control signal FLAG before the CDS signal reading period. Thus, as in an example of FIG. 19, the multiplexer 322 mixes the output Vco of the comparison unit 181 and the control signal FLAG, and in this manner, the counter 172 and the latch 324 can obtain required signals via a single signal line.

That is, with this configuration, the latch 324 can latch the control signal FLAG generated by the latch 321, and can control the counter 172 on the basis of the control signal FLAG. Thus, the column A/D conversion unit 151 is configured such that the timing of obtaining the determination result is the same between the latch 321 and the latch 324, and therefore, the data to be latched can be the same between the latch 321 and the latch 324 at all times. This can reduce failure in calculation.

Moreover, as illustrated in FIG. 17, a majority (the signal lines from the multiplexer 322 to a point from which the latch 324 obtains the mixed signal) of the signal lines between the comparison unit 181 and the counter 172 can be formed as a single line, and an increase in the circuit area can be suppressed. Further, an increase in the number of electrodes 323 formed at such a single-line portion of the signal lines can be suppressed. Thus, even when the comparison unit 181 and the counter 172 are formed on the different semiconductor substrates, an increase in the circuit area can be suppressed.

That is, the column A/D conversion unit 151 (i.e., the image sensor 100) can reduce failure in calculation while suppressing an increase in the circuit area and an increase in the development and manufacturing costs. Further, an increase in the power consumption can be also suppressed.

Note that as illustrated in FIG. 19, when any of the above-described signals is not output, the multiplexer 322 may be in a stand-by state for subsequent output. For example, before the comparison unit 181 outputs a reset signal comparison result (at timing before "P-PHASE" in an "OUTPUT" section in FIG. 19 begins), the multiplexer 322 may select and output the output Vco of the comparison unit 181 ("VCO" on the left side of "FLAG" in a "MUX SELECTION" section in FIG. 19 may begin). Alternatively, before the comparison unit 181 outputs the result of determination of the signal level of the pixel signal (at timing before "DETERMINATION" in the "OUTPUT" section in FIG. 19 begins), the multiplexer 322 may select and output the control signal FLAG ("FLAG" in the "MUX SELECTION" section in FIG. 19 may begin), for example. Further, as another alternative, before the comparison unit 181 outputs the pixel signal comparison result (at timing before "D-PHASE" in the "OUTPUT" section in FIG. 19 begins), the multiplexer 322 may select and output the output Vco of the comparison unit 181 ("VCO" on the right side of "FLAG" in the "MUX SELECTION" section in FIG. 19 may begin), for example.

<Column A/D Conversion Unit>

It has been described above that the output of the NAND gate 333 of the comparison unit 181 configured as illustrated in FIG. 18 is mixed with the control signal FLAG. However, the configuration example of the column A/D conversion unit 151 is not limited to such an example.

For example, a signal comparison unit may be configured to compare the signal level of the analog signal with the signal level of the reference signal, a logical NOT unit may be configured to obtain a logical NOT (perform inversion) of a comparison result obtained by the signal comparison unit, a logical AND unit may be configured to obtain a logical AND of the output of the logical NOT unit and a predetermined control signal, and a logical NOR unit maybe configured to obtain a logical NOR of the output of the logical AND unit and the signal indicating the reference signal selected by the selection unit.

Figure 20:
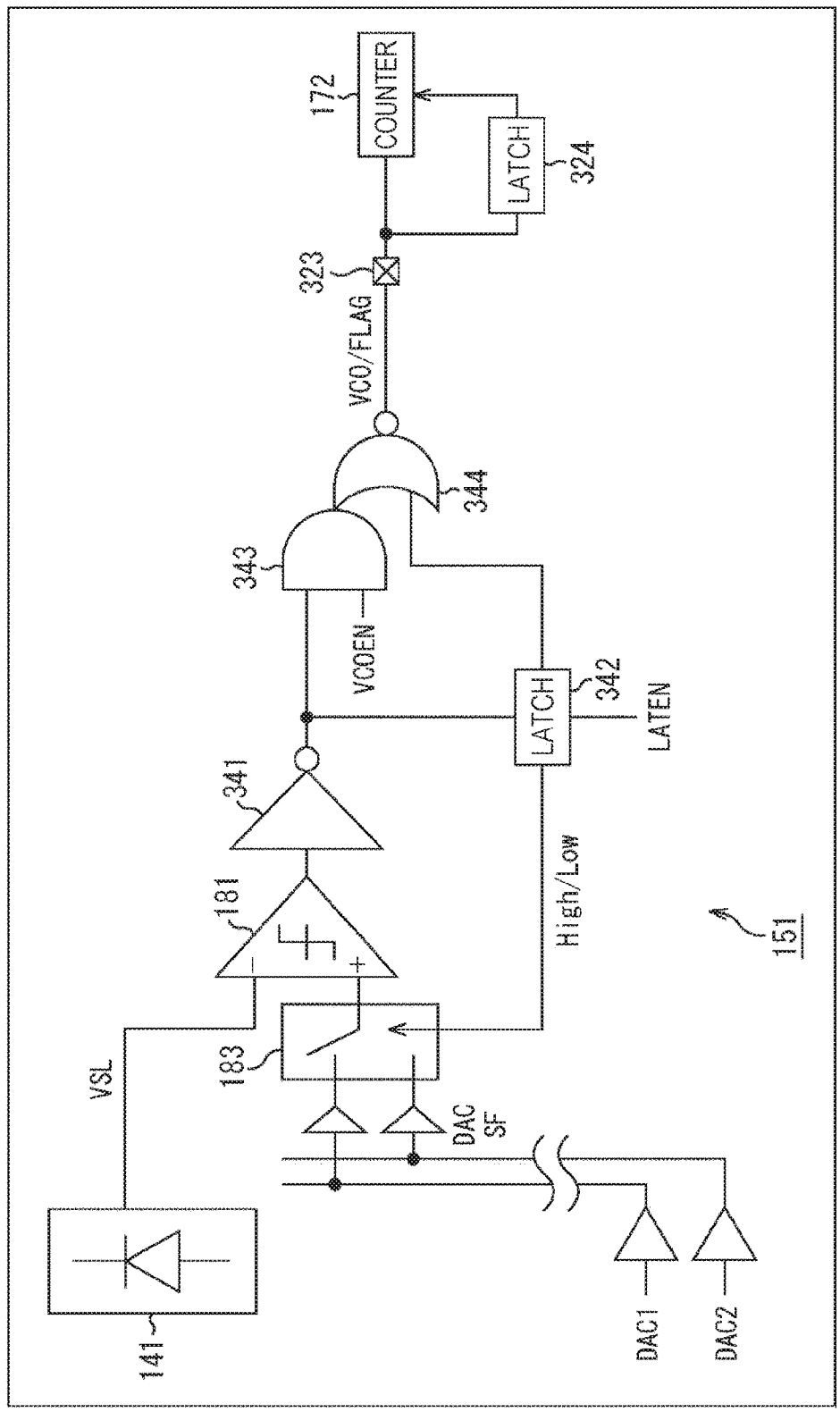
FIG. 20 is a diagram of still another main configuration example of the column A/D conversion unit.

A main configuration example of the column A/D conversion unit 151 in this case is illustrated in FIG. 20. As illustrated in FIG. 20, the column A/D conversion unit 151 has, in this case, a configuration basically similar to the configuration examples of FIGS. 17 and 18. However, instead of the latch 321, the multiplexer 322, and the NAND gate 333 of the comparison unit 181, the column A/D conversion unit 151 includes a latch 342, an AND gate 343, and a NOR gate 344. That is, instead of the NAND gate 333 and the multiplexer 322, the column A/D conversion unit 151 includes a composite gate of the AND gate 343 and the NOR gate 344.

The latch 342 is configured to latch the output (an internal signal of the comparison unit 181) of the NOT gate 332 of the comparison unit 181. The latch 342 supplies the switching unit 183 with the control signals (the control signal SW1 and the control signal SW2) corresponding to such a value. Moreover, the latch 342 generates, from the latched signal, a logical NOT of the identification signal FLAG for identifying the slope gain for controlling the value of the counter 172 on the basis of a control signal LATEN, and then, supplies the composite gate (the NOR gate 344) with such a signal.

At timing corresponding to control using a control signal VCOEN, the AND gate 343 of the composite gate supplies the NOR gate 344 of the composite gate with the output (the internal signal of the comparison unit 181) of the NOT gate 332 of the comparison unit 181.

The NOR gate 344 of the composite gate supplies, via a single signal line, the counter 172 with a logical NOT of the output (a logical NOT of the output VCO of the comparison unit 181) of the NOT gate 332 of the comparison unit 181 or a logical NOT of the logical NOT of the control signal FLAG, i.e., the output VCO of the comparison unit 181 or the control signal FLAG.

With this configuration, the output VCO of the comparison unit 181 and the control signal FLAG can be transmitted to the counter 172 and the latch 324 via a common signal line (a single signal line in a majority portion). Moreover, an increase in the number of electrodes 323 formed in such a single-line portion of the signal lines can be suppressed. Thus, even when the comparison unit 181 and the counter 172 are formed on the different semiconductor substrates, an increase in the circuit area can be suppressed.

That is, the column A/D conversion unit 151 (i.e., the image sensor 100) can, as in the case of the example of FIG. 17, reduce failure in calculation while suppressing an increase in the circuit area and an increase in the development and manufacturing costs. Further, an increase in the power consumption can be also suppressed.

Moreover, in the case of the example of FIG. 20, a two-stage configuration of the NAND gate 333 and the multiplexer 322 in the comparison unit 181 as in the examples of FIGS. 17 and 18 is replaced with a single-stage configuration of a mixed gate. With this configuration, the influence of noise caused by power supply fluctuation due to inversion for the comparison unit 331 can be more reduced and a LATCH signal can be obtained, as compared to the case of connecting many logic circuits to a later stage.

<4. Fourth Embodiment>

<Physical Configuration of Image Sensor>

Note that an imaging element to which the present technology is applied can be implemented as a package (a chip) in which a semiconductor substrate is sealed or a module configured such that the package (the chip) is placed on a circuit board, for example. For example, in the case of implementing the imaging element as the package (the chip), the imaging element may be, in the package (the chip), formed of a single semiconductor substrate, or may be formed of a plurality of semiconductor substrates overlapping with each other.

Figure 21:
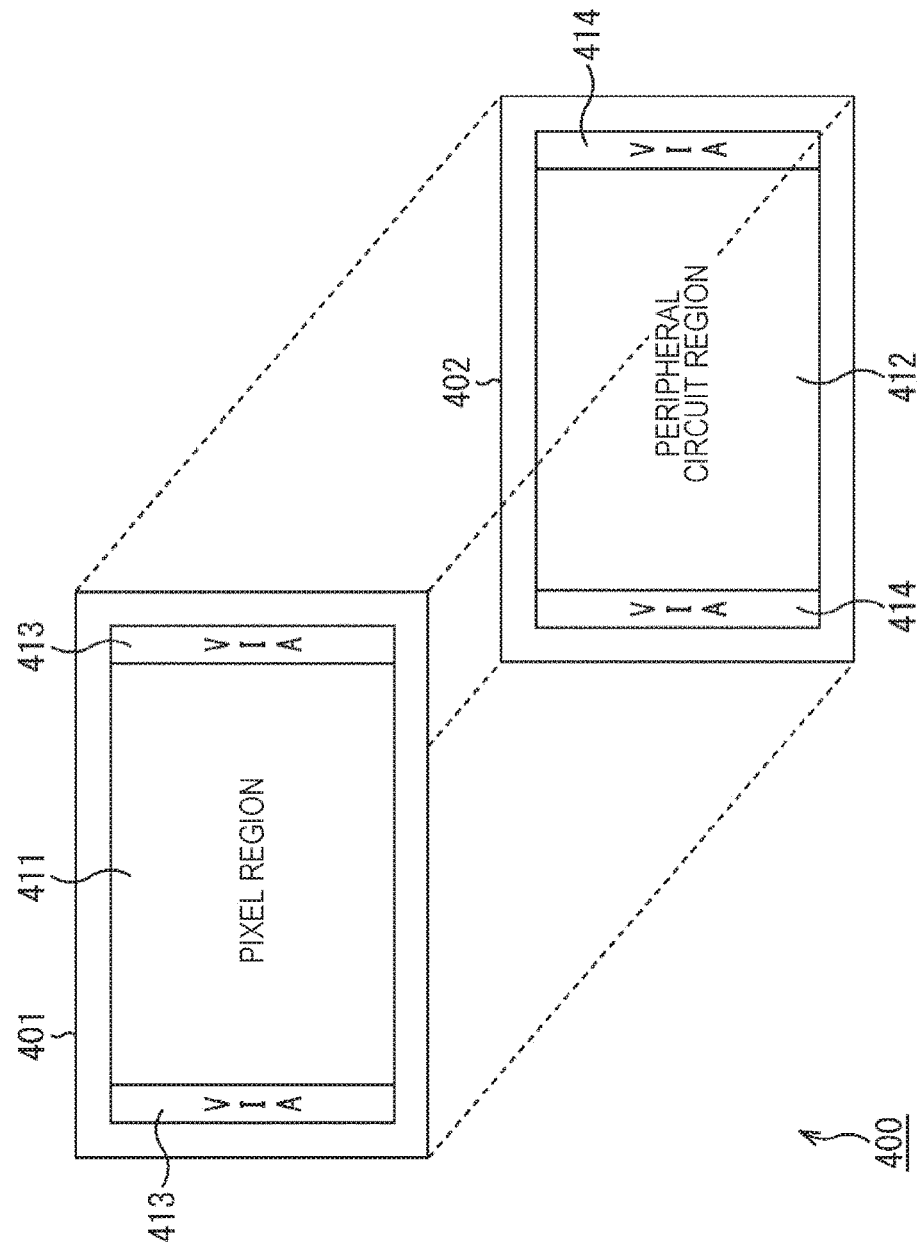
FIG. 21 is a diagram of an example of a physical configuration of the image sensor.

FIG. 21 is a diagram of an example of a physical configuration of the image sensor 100 as the imaging element to which the present technology is applied.

An image sensor 400 illustrated in FIG. 21 is, as in the image sensor 100 described in each embodiment above, an imaging element configured to obtain an image of an object to obtain digital data of the obtained image. Moreover, as illustrated in FIG. 21, the image sensor 400 includes two semiconductor substrates (laminated substrates (a pixel substrate 401 and a circuit board 402)) overlapping with each other. That is, in the image sensor 400, the above-described circuit configuration of the image sensor 100 is formed on the laminated substrates (the pixel substrate 401 and the circuit board 402).

The pixel substrate 401 is provided with a pixel region 411 in which a plurality of unit pixels each including a photoelectric conversion element configured to photoelectrically convert incident light are arranged. Moreover, the circuit board 402 is provided with a peripheral circuit region 412 in which a peripheral circuit configured to process a signal read from the pixel region 411 is formed.

As described above, the pixel substrate 401 and the circuit board 402 overlap with each other, and form a multi-layer structure (a laminated structure). Each pixel of the pixel region 411 of the pixel substrate 401 and the peripheral circuit of the peripheral circuit region 412 of the circuit board 402 are electrically connected together via, e.g., a through-hole via (VIA) formed in each of via regions (VIA) 413 and via regions (VIA) 414.

The present technology is also applicable to such an image sensor with the laminated structure. Note that the number (the layer number) of semiconductor substrates (laminated substrates) is optional, and maybe three or more layers, for example. Needless to say, the plurality of semiconductor substrates employing the configuration of the image sensor 100 do not necessarily form the laminated structure as described above. For example, these semiconductor substrates may be arranged next to each other.

It has been described in each embodiment above that the column A/D conversion unit 151 A/D converts the signals read from the unit pixels 141 of the single column. However, the present invention is not limited to such an example. The signals to be A/D converted by the column A/D conversion unit 151 may be read from the unit pixels 141 belonging to an optional unit pixel group assigned to the column A/D conversion unit 151 itself. For example, the signals read from the unit pixels 141 of multiple columns of the pixel array 111 may be A/D converted. Alternatively, the column A/D conversion unit 151 may A/D convert the signals read from the unit pixels 141 belonging to a partial region of the pixel array 111 assigned to the column A/D conversion unit 151 itself, for example. Further, as another alternative, the column A/D conversion unit 151 may A/D convert the signals sequentially supplied from the unit pixels of all columns, for example. That is, the present technology is also applicable to the A/D conversion unit 112.

Note that the present technology is applicable to other elements than the imaging element. For example, the column A/D conversion unit 151 described above may be applied to other optional devices than the image sensor. Alternatively, the column A/D conversion unit 151 may be an embodiment of the signal processing device to which the present technology is applied. That is, the analog signal to be A/D converted by the column A/D conversion unit 151 is optional, and the column A/D conversion unit 151 may A/D convert other signals than the signal read from the unit pixel 141.

Moreover, the counter 172 may be configured in other devices (e.g., other semiconductor substrates). That is, the comparison unit 171 may be an embodiment of the signal processing device to which the present technology is applied.

<5. Fifth Embodiment>

<Imaging Device>

Figure 22:
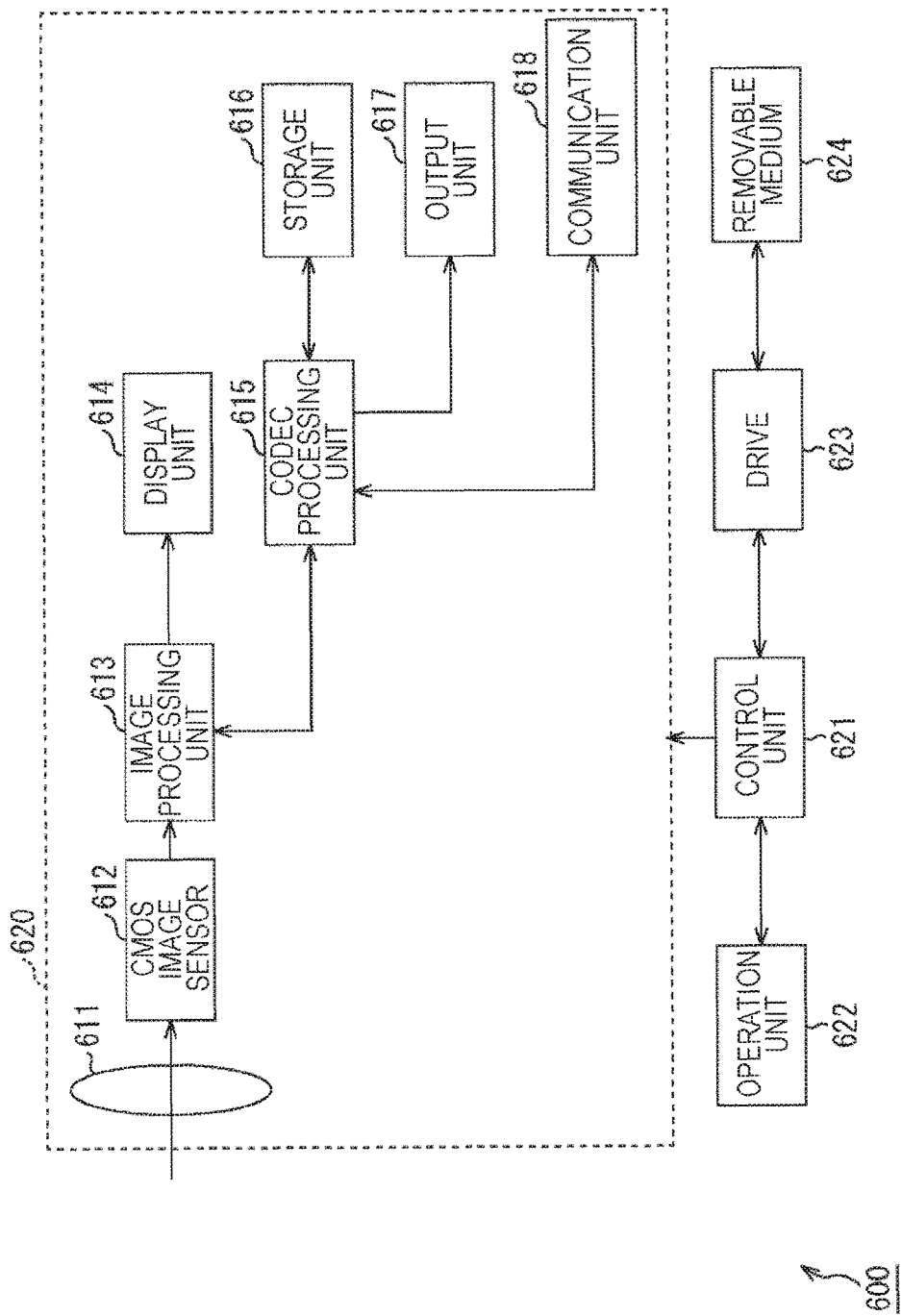
FIG. 22 is a diagram of a main configuration example of an imaging device.

For example, the present technology may be applied to a device (e.g., an electronic apparatus) including an imaging element, such as an imaging device. FIG. 22 is a block diagram of a main configuration example of the imaging device as an example of the electronic apparatus to which the present technology is applied. An imaging device 600 illustrated in FIG. 22 is a device configured to obtain an image of an object to output the image of the object as an electric signal.

As illustrated in FIG. 22, the imaging device 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 includes a lens configured to adjust a focal point to the object to collect light from a position brought to a focus, a diaphragm configured to adjust exposure, and a shutter configured to control imaging timing, for example. The optical unit 611 is configured such that light (incident light) from the object is transmitted through the optical unit 611 and is supplied to the CMOS image sensor 612.

The CMOS image sensor 612 is configured to photoelectrically convert the incident light and perform A/D conversion and signal processing such as CDS for a signal (a pixel signal) from each pixel, thereby supplying the image processing unit 613 with obtained image data after processing.

The image processing unit 613 is configured to process the image data obtained by the CMOS image sensor 612. More specifically, the image processing unit 613 performs, for the image data supplied from the CMOS image sensor 612, various types of image processing such as mixed color correction, black level correction, white balance adjustment, demosaic processing, matrix processing, gamma correction, and YC conversion. The image processing unit 613 supplies the display unit 614 with the image data subjected to the image processing.

The display unit 614 is configured as, e.g., a liquid crystal display, and is configured to display an image (e.g., the image of the object) of the image data supplied from the image processing unit 613.

If necessary, the image processing unit 613 further supplies the codec processing unit 615 with the image data subjected to the image processing.

The codec processing unit 615 is configured to perform a predetermined type of encoding processing for the image data supplied from the image processing unit 613, thereby supplying the storage unit 616 with the obtained encoded data. Moreover, the codec processing unit 615 is configured to read encoded data stored in the storage unit 616 and decode such data to generate decoded image data, thereby supplying the image processing unit 613 with the decoded image data.

The image processing unit 613 performs a predetermined type of image processing for the decoded image data supplied from the codec processing unit 615. The image processing unit 613 supplies the display unit 614 with the decoded image data subjected to the image processing. The display unit 614 is configured as, e.g., a liquid crystal display, and displays an image of the decoded image data supplied from the image processing unit 613.

Moreover, the codec processing unit 615 may supply the output unit 617 with encoded data obtained by encoding of the image data supplied from the image processing unit 613 or encoded data of the image data read from the storage unit 616, thereby outputting such data to the outside of the imaging device 600. Alternatively, the codec processing unit 615 may supply the output unit 617 with the image data before encoding or the decoded image data obtained by decoding of the encoded data read from the storage unit 616, thereby outputting such data to the outside of the imaging device 600.

Further, the codec processing unit 615 may transmit the image data, the encoded data of the image data, or the decoded image data to other devices via the communication unit 618. Moreover, the codec processing unit 615 may obtain the image data or the encoded data of the image data via the communication unit 618. The codec processing unit 615 optionally encodes or decodes the image data or the encoded data of the image data obtained via the communication unit 618, for example. As described above, the codec processing unit 615 may supply the obtained image data or encoded data to the image processing unit 613, and may output such data to the storage unit 616, the output unit 617, and the communication unit 618.

The storage unit 616 is configured to store, e.g., the encoded data supplied from the codec processing unit 615. The encoded data stored in the storage unit 616 is, as necessary, read and decoded by the codec processing unit 615. The image data obtained by decoding processing is supplied to the display unit 614, and the image corresponding to the obtained image data is displayed.

The output unit 617 includes an external output interface such as an external output terminal, and is configured to output various types of data to the outside of the imaging device 600 via the external output interface, the data being supplied via the codec processing unit 615.

The communication unit 618 is configured to supply another device as a communication partner in predetermined communication (wired communication or wireless communication) with various types of information such as the image data or the encoded data supplied from the codec processing unit 615. Moreover, the communication unit 618 is configured to obtain various types of information such as the image data or the encoded data from another device as the communication partner in the predetermined communication (the wired communication or the wireless communication), thereby supplying the codec processing unit 615 with such information.

The control unit 621 is configured to control operation of each processing unit (each processing unit within a dashed line 620, the operation unit 622, and the drive 623) of the imaging device 600.

The operation unit 622 includes an optional input device such as a jog dial (trademark), a key, a button, or a touch panel, and is configured to receive, e.g., user's operation input to supply the control unit 621 with a signal corresponding to the operation input.

The drive 623 is configured to read information stored in a removable medium 624 attached to the drive 623 itself, such as a magnetic disk, an optical disk, a magnetic optical disk, or a semiconductor memory. The drive 623 reads various types of information such as a program and data from the removable medium 624, and then, supplies the control unit 621 with such information. Moreover, when the writable removable medium 624 is attached to the drive 623 itself, the drive 623 can store, in the removable medium 624, various types of information supplied via the control unit 621, such as the image data or the encoded data.

The present technology as described in each embodiment above is applied as the above-described CMOS image sensor 612 of the imaging device 600. That is, the above-described image sensor 100 is used as the CMOS image sensor 612. With this configuration, the size of the CMOS image sensor 612 can be more easily reduced, and an increase in development and manufacturing costs can be suppressed. Further, an increase in power consumption can be also suppressed.

Thus, since the above-described image sensor 100 is applied as the CMOS image sensor 612 of the imaging device 600, the size of the CMOS image sensor 612 can be more reduced, and therefore, reduction in the size of the imaging device 600 can be more easily realized. Moreover, with reduction in the size of the CMOS image sensor 612, designing and manufacturing can be more facilitated, and the cost of the CMOS image sensor 612 is further reduced. Thus, an increase in the development and manufacturing costs of the imaging device 600 can be suppressed. Further, the power consumption of the CMOS image sensor 612 is reduced, and therefore, an increase in the power consumption can be also suppressed.

The above-described series of processing can be implemented by hardware, or can be implemented by software. In the case of executing the above-described series of processing by the software, a program forming the software is installed from a network or a recording medium.

For example, such a recording medium includes, as illustrated in FIG. 22, the removable medium 624 arranged separately from a device body to record a program, the removable medium being distributed for delivering a program to a user. The removable medium 624 includes a magnetic disk (including a flexible disk) or an optical disk (including a CD-ROM or a DVD). The removable medium 624 further includes a magnetic optical disk (including a Mini Disc (MD)) or a semiconductor memory.

In this case, the program can be installed on the storage unit 616 in such a manner that the removable medium 624 is attached to the drive 623.

Moreover, the program can be also provided via a wired or wireless transmission medium such as a local area network, the Internet, and digital satellite broadcasting. In this case, the program can be received by the communication unit 618, and then, can be installed on the storage unit 616.

In addition, the program can be installed in advance on, e.g., a read only memory (ROM) in the storage unit 616 or the control unit 621.

Note that the program to be executed by a computer may be a program for performing processing in chronological order as described in the present specification or a program for performing processing in parallel or performing processing at desired timing such as timing upon calling.

Moreover, in the present specification, steps for the program recorded in the recording medium include, needless to say, not only the processing performed in chronological order as described in the present specification, but also the processing not necessarily performed in chronological order but executed in parallel or individually.

Further, each processing step described above can be executed in each of the above-described devices or other optional devices than each of the above-described devices. In this case, the device configured to execute the processing may has functions (e.g., functional blocks) required for executing the processing. Moreover, information required for the processing may be optionally transmitted to the device.

In addition, in the present specification, the "system" means a group of multiple components (devices, modules (parts), etc.), and it is not a matter of whether or not all of the components are in the same housing. Thus, any of a plurality of devices housed in separate housings and connected together via a network and a single device configured such that a plurality of modules are housed in a single housing is considered as the system.

Moreover, the configuration described above as the single device (or the single processing unit) may be divided to form a plurality of devices (or a plurality of processing units). Conversely, the configurations described above as the plurality of devices (or the plurality of processing units) may be collectively configured as a single device (or a single processing unit). In addition, needless to say, other configurations than above maybe added to the configuration of each device (or each processing unit). Further, as long as the same configuration and operation of the entire system are substantially applied, part of a certain device (or a certain processing unit) may be included in the configuration of another device (or another processing unit).

The preferable embodiments of the present disclosure have been described above in detail with reference to the attached drawings, but the technical scope of the present disclosure is not limited to such examples. It is obvious that a person having ordinary skill in the technical field of the present disclosure arrives at various changes or modifications within the scope of the technical idea described in the claims. It is appreciated that these changes and modifications fall within the technical scope of the present disclosure, needless to say.

For example, the present technology can employ a cloud computing configuration for processing a single function in a shared and cooperative manner by a plurality of devices via a network.

Moreover, each step described with reference to the above-described flow chart can be not only executed by a single device, but also executed in a shared manner by a plurality of devices.

Further, in the case where a single step includes multiple types of processing, such multiple types of processing in the single step can be not only executed by a single device, but also executed in a shared manner by a plurality of devices.

In addition, the present technology is not limited to above, and can be implemented as any configuration provided in the device or the devices forming the system as described above, such as a processor as a system large scale integration (LSI), a module using a plurality of processors, a unit using a plurality of modules, a set (i.e., a partial configuration of the device) configured such that other functions are further added to the unit.

Note that the present technology can also employ the following configurations.

(1) A signal processing device including:
   a comparison unit configured to compare a signal level of an analog signal with a signal level of a reference signal;
   a selection unit configured to select, from a plurality of reference signals, the reference signal to be supplied to the comparison unit; and
   a switching unit capable of switching a signal line connected to an input terminal of the comparison unit such that a signal line via which the reference signal selected by the selection unit is transmitted is connected to the input terminal of the comparison unit,
   wherein the comparison unit includes a floating node as the input terminal,
   the selection unit includes a signal line in which a parasitic capacitance is caused between the signal line and the floating node as the input terminal of the comparison unit, and
   the signal line of the selection unit is configured to transmit an identical level of signal in multiple comparison processes performed by the comparison unit.

(2) The signal processing device according to (1), wherein
   the comparison unit sequentially compares a signal level of a reset signal read from a unit pixel with each signal level of the plurality of reference signals,
   the selection unit selects anyone of the plurality of reference signals according to a signal level of a pixel signal read from the unit pixel,
   the switching unit switches, as necessary, the signal line connected to the input terminal of the comparison unit such that the signal line via which the reference signal selected by the selection unit is transmitted is connected to the input terminal of the comparison unit,
   the comparison unit further compares the signal level of the pixel signal with the signal level of the reference signal selected by the selection unit, and
   the signal line of the selection unit transmits the identical level of signal in both of comparison, by the comparison unit, between the signal level of the reset signal and the signal level of the reference signal selected by the selection unit and comparison between the signal level of the pixel signal and the signal level of the reference signal by the comparison unit.

(3) The signal processing device according to (2), wherein a signal level of the signal transmitted via the signal line of the selection unit indicates the reference signal selected by the selection unit.

(4) The signal processing device according to any of (1) to (3), wherein
the comparison unit is initialized, sequentially compares a signal level of a reset signal read from a unit pixel with a signal level of each reference signal, and compares a signal level of a pixel signal read from the unit pixel with a signal level of a predetermined reference signal,
the selection unit selects any one of the plurality of reference signals on the basis of a result of comparison between the signal level of the pixel signal and the signal level of the predetermined reference signal by the comparison unit,
the switching unit switches, as necessary, the signal line connected to the input terminal of the comparison unit such that the signal line via which the reference signal selected by the selection unit is transmitted is connected to the input terminal of the comparison unit,
the comparison unit further compares the signal level of the pixel signal with the signal level of the reference signal selected by the selection unit, and
the signal line of the selection unit transmits the identical level of signal in both of initialization of the comparison unit and comparison between the signal level of the pixel signal and the signal level of the predetermined reference signal by the comparison unit.

(5) The signal processing device according to (4), wherein a signal level of the signal transmitted via the signal line of the selection unit indicates the reference signal selected by the selection unit.

(6) The signal processing device according to any of (1) to (5), wherein
the selection unit selects, from the plurality of reference signals, the reference signal to be supplied to the comparison unit on the basis of a result of comparison performed by the comparison unit.

(7) The signal processing device according to any of (1) to (6), further including:
a measurement unit configured to measure a time until a result of comparison performed by the comparison unit changes and output a measurement result as an A/D conversion result of the analog signal.

(8) The signal processing device according to any of (1) to (7), wherein
the comparison unit compares the signal level of the reference signal with the signal level of the analog signal read from a unit pixel of a pixel array belonging to a unit pixel group assigned to the comparison unit itself.

(9) An imaging element including:
a pixel array configured such that unit pixels are arranged in a matrix;
a comparison unit configured to compare a signal level of an analog signal read from each unit pixel of the pixel array with a signal level of a reference signal;
a selection unit configured to select, from a plurality of reference signals, the reference signal to be supplied to the comparison unit; and
a switching unit capable of switching a signal line connected to an input terminal of the comparison unit such that a signal line via which the reference signal selected by the selection unit is transmitted is connected to the input terminal of the comparison unit,
wherein the comparison unit includes a floating node as the input terminal,
the selection unit includes a signal line in which a parasitic capacitance is caused between the signal line and the floating node as the input terminal of the comparison unit, and
the signal line of the selection unit is configured to transmit an identical level of signal in multiple comparison processes performed by the comparison unit.

(10) An electronic apparatus including:
an imaging unit configured to obtain an image of an object; and
an image processing unit configured to process image data obtained by imaging of the imaging unit,
wherein the imaging unit includes
a pixel array configured such that unit pixels are arranged in a matrix,
a comparison unit configured to compare a signal level of an analog signal read from each unit pixel of the pixel array with a signal level of a reference signal,
a selection unit configured to select, from a plurality of reference signals, the reference signal to be supplied to the comparison unit, and
a switching unit capable of switching a signal line connected to an input terminal of the comparison unit such that a signal line via which the reference signal selected by the selection unit is transmitted is connected to the input terminal of the comparison unit,
wherein the comparison unit includes a floating node as the input terminal,
the selection unit includes a signal line in which a parasitic capacitance is caused between the signal line and the floating node as the input terminal of the comparison unit, and
the signal line of the selection unit is configured to transmit an identical level of signal in multiple comparison processes performed by the comparison unit.

(11) A signal processing device including:
a comparison unit configured to compare a signal level of an analog signal with a signal level of a reference signal;
a selection unit configured to select, from a plurality of reference signals, the reference signal to be supplied to the comparison unit;
a switching unit capable of switching a signal line connected to the comparison unit such that a signal line via which the reference signal selected by the selection unit is transmitted is connected to the comparison unit;
a mixing unit configured to mix a signal indicating a comparison result obtained by the comparison unit with a signal indicating the reference signal selected by the selection unit;
a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line; and
a control unit configured to control measurement of the measurement unit on the basis of the signal indicating the reference signal selected by the selection unit, the signal being contained in the signal output from the mixing unit and transmitted via the single signal line.

(12) The signal processing device according to (11), wherein
the mixing unit transmits, via the single signal line, the
signal indicating the comparison result obtained by the
comparison unit and the signal indicating the reference
signal selected by the selection unit in different periods.
(13) The signal processing device according to (12), wherein
the comparison unit sequentially compares a signal level
of a reset signal read from a unit pixel with a signal
level of each reference signal, and compares a signal
level of a pixel signal read from the unit pixel with a
signal level of a predetermined reference signal,
the selection unit selects anyone of the plurality of reference signals,
the switching unit switches, as necessary, the signal line
connected to the comparison unit such that the signal
line via which the reference signal selected by the
selection unit is transmitted is connected to the comparison unit,
the comparison unit further compares the signal level of
the pixel signal with the signal level of the reference
signal selected by the selection unit, and
the mixing unit
transmits, via the single signal line, the signal indicating the comparison result in a period for comparing
the signal level of the reset signal with the signal
level of each reference signal by the comparison
unit,
transmits, via the single signal line, the signal indicating the reference signal selected by the selection unit
in a period for comparing the signal level of the pixel
signal with the signal level of the predetermined
reference signal by the comparison unit, and
transmits, via the single signal line, the signal indicating the comparison result in a period for comparing,
by the comparison unit, the signal level of the pixel
signal with the signal level of the reference signal
selected by the selection unit.
(14) The signal processing device according to any of (11)
to (13), wherein
the comparison unit includes
a signal comparison unit configured to compare the
signal level of the analog signal with the signal level
of the reference signal,
a logical NOT unit configured to invert a comparison
result obtained by the signal comparison unit, and
a logical NAND unit configured to obtain a logical
NAND of output of the logical NOT unit and a
predetermined control signal, and
the mixing unit mixes output of the logical NAND unit
with the signal indicating the reference signal selected
by the selection unit.
(15) The signal processing device according to any of (11)
to (14), wherein
the comparison unit includes
a signal comparison unit configured to compare the
signal level of the analog signal with the signal level
of the reference signal, and
a logical NOT unit configured to invert a comparison
result obtained by the signal comparison unit, and
the mixing unit includes
a logical AND unit configured to obtain a logical AND
of output of the logical NOT unit and a predetermined control signal, and
a logical NOR unit configured to obtain a logical NOR
of output of the logical AND unit and the signal
indicating the reference signal selected by the selection unit.
(16) The signal processing device according to any of (11)
to (15), wherein
the selection unit selects, from the plurality of reference
signals, the reference signal to be supplied to the
comparison unit according to the comparison result
obtained by the comparison unit.
(17) The signal processing device according to any of (11)
to (16), wherein
the comparison unit compares the signal level of the
reference signal with the signal level of the analog
signal read from a unit pixel of a pixel array belonging
to a unit pixel group assigned to the comparison unit
itself.
(18) The signal processing device according to any of (11)
to (17), wherein
the comparison unit, the selection unit, the switching unit,
and the mixing unit are formed on a semiconductor
substrate different from that for the measurement unit
and the control unit.
(19) An imaging element including:
a pixel array configured such that unit pixels are arranged
in a matrix;
a comparison unit configured to compare a signal level of
an analog signal read from each unit pixel of the pixel
array with a signal level of a reference signal;
a selection unit configured to select, from a plurality of
reference signals, the reference signal to be supplied to
the comparison unit;
a switching unit capable of switching a signal line connected to the comparison unit such that a signal line via
which the reference signal selected by the selection unit
is transmitted is connected to the comparison unit;
a mixing unit configured to mix a signal indicating a
comparison result obtained by the comparison unit with
a signal indicating the reference signal selected by the
selection unit;
a measurement unit configured to measure a time until a
value of the signal indicating the comparison result
obtained by the comparison unit changes and output a
measurement result as an A/D conversion result of the
analog signal, the signal being contained in a signal
output from the mixing unit and transmitted via a single
signal line; and
a control unit configured to control measurement of the
measurement unit on the basis of the signal indicating
the reference signal selected by the selection unit, the
signal being contained in the signal output from the
mixing unit and transmitted via the single signal line.
(20) An electronic apparatus including:
an imaging unit configured to obtain an image of an
object; and
an image processing unit configured to process image data
obtained by imaging of the imaging unit,
wherein the imaging unit includes
a pixel array configured such that unit pixels are
arranged in a matrix,
a comparison unit configured to compare a signal level
of an analog signal read from each unit pixel of the
pixel array with a signal level of a reference signal,
a selection unit configured to select, from a plurality of
reference signals, the reference signal to be supplied
to the comparison unit, and
a switching unit capable of switching a signal line
connected to the comparison unit such that a signal
line via which the reference signal selected by the
selection unit is transmitted is connected to the
comparison unit, a mixing unit configured to mix a signal indicating a comparison result obtained by the comparison unit with a signal indicating the reference signal selected by the selection unit, a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line, and a control unit configured to control measurement of the measurement unit on the basis of the signal indicating the reference signal selected by the selection unit, the signal being contained in the signal output from the mixing unit and transmitted via the single signal line.

REFERENCE SIGNS LIST

100 Image sensor
111 Pixel array
112 A/D conversion unit
113 Horizontal transfer unit
121 Control timing generation unit
122 Pixel scanning unit
123 A/D conversion control unit
131, 132 Reference voltage generation unit
141 Unit pixel
151 Column A/D conversion unit
161 Photodiode
162 Transfer transistor
163 Reset transistor
164 Amplification transistor
165 Select transistor
171 Comparison unit
172 Counter
181 Comparison unit
182 Selection unit
183 Switching unit
184, 185 Capacitor
191 Determination unit
192 Switch control unit
201 NOT gate
202 Latch
203 Switch
204 Amplifier
205 NOT gate
321 Latch
322 Multiplexer
323 Electrode
324 Latch
331 Comparison unit
332 NOT gate
333 NAND gate
342 Latch
343 AND gate
344 NOR gate
400 Image sensor
401 Pixel substrate
402 Circuit board
411 Pixel region
412 Peripheral circuit region
413, 413 Via region
600 Imaging device
612 CMOS image sensor

The invention claimed is:

1. A signal processing device, comprising:
a comparison unit configured to compare a signal level of an analog signal with a signal level of a reference signal;
a selection unit configured to select, from a plurality of reference signals, the reference signal to be supplied to the comparison unit; and
a switching unit capable of switching a signal line connected to an input terminal of the comparison unit such that a signal line via which the reference signal selected by the selection unit is transmitted is connected to the input terminal of the comparison unit,
wherein the comparison unit includes a floating node as the input terminal,
the selection unit includes a signal line in which a parasitic capacitance is caused between the signal line and the floating node as the input terminal of the comparison unit, and
the signal line of the selection unit is configured to transmit an identical level of signal in multiple comparison processes performed by the comparison unit.

2. The signal processing device according to claim 1, wherein
the comparison unit is further configured to sequentially compare a signal level of a reset signal read from a unit pixel with each signal level of the plurality of reference signals,
the selection unit is further configured to select one of the plurality of reference signals according to a signal level of a pixel signal read from the unit pixel,
the switching unit is further configured to switch, as necessary, the signal line connected to the input terminal of the comparison unit such that the signal line via which the reference signal selected by the selection unit is transmitted is connected to the input terminal of the comparison unit,
the comparison unit is further configured to compare the signal level of the pixel signal with the signal level of the reference signal selected by the selection unit, and
the signal line of the selection unit is further configured to transmit the identical level of signal in both of comparison, by the comparison unit, between the signal level of the reset signal and the signal level of the reference signal selected by the selection unit and comparison between the signal level of the pixel signal and the signal level of the reference signal by the comparison unit.

3. The signal processing device according to claim 2, wherein
a signal level of the signal transmitted via the signal line of the selection unit indicates the reference signal selected by the selection unit.

4. The signal processing device according to claim 1, wherein
the comparison unit is initialized, sequentially compares a signal level of a reset signal read from a unit pixel with each signal level of the plurality of reference signals, and compare a signal level of a pixel signal read from the unit pixel with a signal level of a predetermined reference signal,
the selection unit is futher configured to select one of the plurality of reference signals based on a result of comparison between the signal level of the pixel signal and the signal level of the predetermined reference signal by the comparison unit, the switching unit is further configured to switch, as necessary, the signal line connected to the input terminal of the comparison unit such that the signal line via which the reference signal selected by the selection unit is transmitted is connected to the input terminal of the comparison unit, the comparison unit is further configured to compare the signal level of the pixel signal with the signal level of the reference signal selected by the selection unit, and the signal line of the selection unit is further configured to transmit the identical level of signal in both of initialization of the comparison unit and comparison between the signal level of the pixel signal and the signal level of the predetermined reference signal by the comparison unit.

5. The signal processing device according to claim 4, wherein
a signal level of the signal transmitted via the signal line of the selection unit indicates the reference signal selected by the selection unit.

6. The signal processing device according to claim 1, wherein
the selection unit is further configured to select, from the plurality of reference signals, the reference signal to be supplied to the comparison unit based on a result of comparison performed by the comparison unit.

7. The signal processing device according to claim 1, further comprising:
a measurement unit configured to measure a time until a result of the comparison performed by the comparison unit changes and output a measurement result as an A/D conversion result of the analog signal.

8. The signal processing device according to claim 1, wherein
the comparison unit is further configured to compare the signal level of the reference signal with the signal level of the analog signal read from a unit pixel of a pixel array belonging to a unit pixel group assigned to the comparison unit itself.

9. An imaging element, comprising:
a pixel array configured such that unit pixels are arranged in a matrix;
a comparison unit configured to compare a signal level of an analog signal read from each unit pixel of the pixel array with a signal level of a reference signal;
a selection unit configured to select, from a plurality of reference signals, the reference signal to be supplied to the comparison unit; and
a switching unit capable of switching a signal line connected to an input terminal of the comparison unit such that a signal line via which the reference signal selected by the selection unit is transmitted is connected to the input terminal of the comparison unit,
wherein the comparison unit includes a floating node as the input terminal,
the selection unit includes a signal line in which a parasitic capacitance is caused between the signal line and the floating node as the input terminal of the comparison unit, and
the signal line of the selection unit is configured to transmit an identical level of signal in multiple comparison processes performed by the comparison unit.

10. An electronic apparatus, comprising:
an imaging unit configured to obtain an image of an object; and
an image processing unit configured to process image data obtained by imaging of the imaging unit, wherein the imaging unit includes:
a pixel array configured such that unit pixels are arranged in a matrix,
a comparison unit configured to compare a signal level of an analog signal read from each unit pixel of the pixel array with a signal level of a reference signal,
a selection unit configured to select, from a plurality of reference signals, the reference signal to be supplied to the comparison unit, and
a switching unit capable of switching a signal line connected to an input terminal of the comparison unit such that a signal line via which the reference signal selected by the selection unit is transmitted is connected to the input terminal of the comparison unit,
wherein the comparison unit includes a floating node as the input terminal,
the selection unit includes a signal line in which a parasitic capacitance is caused between the signal line and the floating node as the input terminal of the comparison unit, and
the signal line of the selection unit is configured to transmit an identical level of signal in multiple comparison processes performed by the comparison unit.

11. A signal processing device, comprising:
a comparison unit configured to compare a signal level of an analog signal with a signal level of a reference signal;
a selection unit configured to select, from a plurality of reference signals, the reference signal to be supplied to the comparison unit;
a switching unit capable of switching a signal line connected to the comparison unit such that a signal line via which the reference signal selected by the selection unit is transmitted is connected to the comparison unit;
a mixing unit configured to mix a signal indicating a comparison result obtained by the comparison unit with a signal indicating the reference signal selected by the selection unit;
a measurement unit configured to measure a time until a value of the signal indicating the comparison result obtained by the comparison unit changes, and output a measurement result as an A/D conversion result of the analog signal, the signal being contained in a signal output from the mixing unit and transmitted via a single signal line; and
a control unit configured to control measurement of the measurement unit based on the signal indicating the reference signal selected by the selection unit, the signal being contained in the signal output from the mixing unit and transmitted via the single signal line.

12. The signal processing device according to claim 11, wherein
the mixing unit is further configured to transmit, via the single signal line, the signal indicating the comparison result obtained by the comparison unit and the signal indicating the reference signal selected by the selection unit in different periods.

13. The signal processing device according to claim 12, wherein
the comparison unit is further configured to sequentially compare a signal level of a reset signal read from a unit pixel with each signal level of the plurality of reference signals, and compare a signal level of a pixel signal read from the unit pixel with a signal level of a predetermined reference signal, the selection unit is further configured to select one of the plurality of reference signals, the switching unit is further configured to switch, as necessary, the signal line connected to the comparison unit such that the signal line via which the reference signal selected by the selection unit is transmitted is connected to the comparison unit, the comparison unit is further configured to compare the signal level of the pixel signal with the signal level of the reference signal selected by the selection unit, and the mixing unit is further configured to:
    transmit, via the single signal line, the signal indicating the comparison result in a period for comparing the signal level of the reset signal with the signal level of each reference signal by the comparison unit,
    transmit, via the single signal line, the signal indicating the reference signal selected by the selection unit in a period for comparing the signal level of the pixel signal with the signal level of the predetermined reference signal by the comparison unit, and
    transmit, via the single signal line, the signal indicating the comparison result in a period for comparing, by the comparison unit, the signal level of the pixel signal with the signal level of the reference signal selected by the selection unit.

14. The signal processing device according to claim 11, wherein
the comparison unit includes:
    a signal comparison unit configured to compare the signal level of the analog signal with the signal level of the reference signal,
    a logical NOT unit configured to invert a comparison result obtained by the signal comparison unit, and
    a logical NAND unit configured to obtain a logical NAND of output of the logical NOT unit and a predetermined control signal, and
the mixing unit is further configured to mix output of the logical NAND unit with the signal indicating the reference signal selected by the selection unit.

15. The signal processing device according to claim 11, wherein
the comparison unit includes:
    a signal comparison unit configured to compare the signal level of the analog signal with the signal level of the reference signal, and
    a logical NOT unit configured to invert a comparison result obtained by the signal comparison unit, and
the mixing unit includes:
    a logical AND unit configured to obtain a logical AND of output of the logical NOT unit and a predetermined control signal, and
    a logical NOR unit configured to obtain a logical NOR of output of the logical AND unit and the signal indicating the reference signal selected by the selection unit.

16. The signal processing device according to claim 11, wherein
the selection unit is further configured to select, from the plurality of reference signals, the reference signal to be supplied to the comparison unit according to the comparison result obtained by the comparison unit.

17. The signal processing device according to claim 11, wherein
the comparison unit is further configured to compare the signal level of the reference signal with the signal level of the analog signal read from a unit pixel of a pixel array belonging to a unit pixel group assigned to the comparison unit itself.

18. The signal processing device according to claim 11, wherein
the comparison unit, the selection unit, the switching unit, and the mixing unit are formed on a semiconductor substrate different from that for the measurement unit and the control unit.

19. An imaging element, comprising:
a pixel array configured such that unit pixels are arranged in a matrix;
a comparison unit configured to compare a signal level of an analog signal read from each unit pixel of the pixel array with a signal level of a reference signal;
a selection unit configured to select, from a plurality of reference signals, the reference signal to be supplied to the comparison unit;
a switching unit capable of switching a signal line connected to the comparison unit such that a signal line via which the reference signal selected by the selection unit is transmitted is connected to the comparison unit;
a mixing unit configured to mix a signal indicating a comparison result obtained by the comparison unit with a signal indicating the reference signal selected by the selection unit;
a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line; and
a control unit configured to control measurement of the measurement unit based on the signal indicating the reference signal selected by the selection unit, the signal being contained in the signal output from the mixing unit and transmitted via the single signal line.

20. An electronic apparatus, comprising:
an imaging unit configured to obtain an image of an object; and
an image processing unit configured to process image data obtained by imaging of the imaging unit,
wherein the imaging unit includes:
    a pixel array configured such that unit pixels are arranged in a matrix,
    a comparison unit configured to compare a signal level of an analog signal read from each unit pixel of the pixel array with a signal level of a reference signal,
    a selection unit configured to select, from a plurality of reference signals, the reference signal to be supplied to the comparison unit, and
    a switching unit capable of switching a signal line connected to the comparison unit such that a signal line via which the reference signal selected by the selection unit is transmitted is connected to the comparison unit,
    a mixing unit configured to mix a signal indicating a comparison result obtained by the comparison unit with a signal indicating the reference signal selected by the selection unit,
    a measurement unit configured to measure a time until a value of the signal indicating the comparison result obtained by the comparison unit changes and output a measurement result as an A/D conversion result of the analog signal, the signal being contained in a signal output from the mixing unit and transmitted via a single signal line, and a control unit configured to control measurement of the measurement unit based on the signal indicating the reference signal selected by the selection unit, the signal being contained in the signal output from the mixing unit and transmitted via the single signal line.

\* \* \* \* \*